(12) United States Patent
Okuda et al.

(10) Patent No.: US 6,946,398 B2
(45) Date of Patent: Sep. 20, 2005

(54) METHOD FOR FABRICATING A MICRO MACHINE

(75) Inventors: Shoji Okuda, Aichi (JP); Hiroshi Tokunaga, Nagano (JP); Osamu Tsuboi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 202 days.

(21) Appl. No.: 10/651,051

(22) Filed: Aug. 29, 2003

(65) Prior Publication Data

US 2004/0053507 A1 Mar. 18, 2004

(30) Foreign Application Priority Data

Sep. 18, 2002 (JP) ........................................ 2002-271644

(51) Int. Cl.[7] ............................................ H01L 21/302
(52) U.S. Cl. ........................ 438/694; 438/705; 438/706; 438/717; 438/723; 438/753
(58) Field of Search ................................ 438/694, 705, 438/706, 717, 723, 753

(56) References Cited

U.S. PATENT DOCUMENTS

| | | | |
|---|---|---|---|
| 6,271,955 B1 * | 8/2001 | Atobe et al. ................ | 359/291 |
| 6,555,201 B1 * | 4/2003 | Dhuler et al. ............... | 428/137 |
| 6,756,310 B2 * | 6/2004 | Kretschmann et al. ...... | 438/694 |
| 2002/0131146 A1 * | 9/2002 | Gee et al. .................... | 359/291 |
| 2003/0007262 A1 * | 1/2003 | Tsuboi et al. ............... | 359/847 |
| 2003/0020565 A1 * | 1/2003 | Cornett et al. .............. | 333/197 |

* cited by examiner

*Primary Examiner*—Nadine Norton
*Assistant Examiner*—Binh X. Tran
(74) *Attorney, Agent, or Firm*—Armstrong, Kratz, Quintos, Hanson & Brooks, LLP

(57) ABSTRACT

The method for fabricating a micro machine comprises the step of burying an oxide film 54 in a first semiconductor substrate 6, the step of bonding the first semiconductor substrate to the second semiconductor substrate with an insulation film 18 therebetween, the step of forming a first mask 66 with an opening in a first region and a second region on both sides of the first region, the step of etching the first semiconductor substrate with a first mask 66 and an oxide film 54 as a mask to thereby form a spring portion 20a integral with the first semiconductor substrate between the oxide film and the insulation film to thereby form a torsion bar including the spring portion, the step of forming a second mask 74 with an opening in the first region and the second region, the step of etching the second semiconductor substrate by using the second mask 74, and the step of etching the insulation film 18 in the first region and the second region. The thickness of the torsion bar can be easily controlled. Thus, a micro machine having a torsion bar can be fabricated with high yields.

15 Claims, 28 Drawing Sheets

METHOD FOR FABRICATING A MICRO MACHINE

CROSS-REFERENCE TO RELATED APPLICATION

This application is based upon and claims priority of Japanese Patent Application No.2002-271644, filed on Sep. 18, 2002, the contents being incorporated herein by reference.

BACKGROUND OF THE INVENTION

The present invention relates to a method for fabricating a micro machine, more specifically to a method for fabricating a micro machine having a torsion bar.

Micro machines using micromachining are recently much noted. In micro machines, swinging members are supported by, e.g., torsion bars, that is, torsion bar springs.

FIGS. 25A to 28D are sectional views of a proposed optical switch having a torsion bar in the steps of a method for fabricating the proposed optical switch, which show the method.

First, as shown in FIG. 25A, a silicon substrate 106 and a silicon substrate 168 are bonded to each other with a silicon oxide film 118 therebetween. Then, a metal film 168 is formed on the entire surface of the silicon substrate 106.

Next as shown in FIG. 25B, the metal film 168 is patterned. Then, a mirror 124 and a bump 172 are formed of the metal film 168.

Then, as shown in FIG. 25C, silicon oxide films 174, 166 are formed respectively on the upper surface of the silicon substrate 106 and the under surface of the silicon substrate 108.

Next, as shown in FIG. 25D, the silicon oxide film 174 is patterned by photolithography.

Then, as shown in FIG. 26A, the silicon oxide film 166 is patterned by photolithography.

Then, as shown n FIG. 26B, a metal film 160 is formed on the under surface of the silicon substrate 108.

Next, as shown in FIG. 26C, the metal film 160 is patterned. Thus, a bump 164 is formed of the metal film 160.

Next, as shown in FIG. 26D, a photoresist film 100 is formed on the silicon substrate 106. Then, the photoresist film 100 is patterned by photolithography.

Then, as shown in FIG. 27A, with the photoresist film 100 as a mask, the silicon substrate 106 is etched. Thus, steps 101 are formed on the silicon substrate 106.

Next, as shown in FIG. 27B, the photoresist film 100 is removed.

Then, as shown in FIG. 27C, a photoresist film 102 is formed on the under surface of the silicon substrate 108. Then, the photoresist film 102 is patterned by photolithography.

Then, as shown in FIG. 27D, with the photoresist film 102 as a mask, the silicon substrate 108 is etched. Thus, steps 103 are formed on the silicon substrate 108.

Then, as shown in FIG. 28A, the photoresist film 102 is removed.

Next, as shown in FIG. 28B, with the silicon oxide film 174 as a mask, the silicon substrate 106 is etched, retaining the steps 101. Thus, a movable electrode 112 having a digital portion 112a of the silicon substrate 106 is formed while a spring portion 120a of the silicon substrate 106 is formed.

Then, as shown in FIG. 28C, with the silicon oxide film 166 as a mask, the silicon substrate 108 is etched, retaining the steps 103. Thus, a stationary electrode 110 having a digital portion 110a of the silicon substrate 108 is formed while a spring portion 120b of the silicon substrate 108 is formed.

Then, as shown in FIG. 28D, the silicon oxide films 174, 166, 118 are etched off. Thus, the micro machine having the torsion bar 116 which comprises the spring portion 120a and the spring portion 120b is fabricated.

However, in the method for fabricating the proposed micro machine as shown in FIGS. 25A to 28D, wherein the silicon substrate 106, 108 is etched, retaining the steps 101, 103 to thereby form the spring portions 120a, 120b constituting the torsion bar 116, it is very difficult to control the thickness and shape of the spring portions 120a, 120b forming the torsion bar 116. Accordingly, the method for fabricating the proposed micro machine makes the yields low.

SUMMARY OF THE INVENTION

An object of the present invention is to provide a method for fabricating a micro machine having a torsion bar with high yields.

According to one aspect of the present invention, there is provided a method for fabricating a micro machine comprising the steps of: implanting oxygen ions into a first region of a first semiconductor substrate, and performing thermal processing to form an oxide film buried in the first semiconductor substrate, spaced from the surface of the first semiconductor substrate; bonding the surface of the first semiconductor substrate with the oxide film buried in to a second semiconductor substrate with an insulation film therebetween; forming a first mask with an opening in the first region and a second region on both sides of the first region on the surface of the first semiconductor substrate, which is opposite to the surface with the oxide film buried in; etching the first semiconductor substrate with the first mask and the oxide film as a mask to form a spring portion integral with the first semiconductor substrate between the oxide film and the insulation film to thereby form a torsion bar including the spring portion; forming a second mask with an opening in the first region and the second region on the surface of the second semiconductor substrate, which is opposite to the surface bonded to the first semiconductor substrate; etching the second semiconductor substrate with the second mask as a mask; and etching the insulation film in the first region and the second region.

According to another aspect of the present invention, there is provided a method for fabricating a micro machine comprising the steps of: forming an insulation film on a semiconductor substrate; forming a first semiconductor layer on the insulation film; forming a first mask in a first region on the first semiconductor layer; growing a second semiconductor layer on the first semiconductor layer and the first mask; forming on the second semiconductor layer a second mask with an opening in the first region and a second region on both sides of the first region; etching the first semiconductor layer and the second semiconductor layer with the first mask and the second mask as a mask to thereby form a torsion bar integral with the first semiconductor layer between the first mask and the insulation film; forming a third mask with an opening in the first region and the second region on the surface of the semiconductor substrate, which is opposite to the surface with the first semiconductor layer formed on; and etching the semiconductor substrate with the third mask as a mask.

According to the present invention, an oxide film is buried in a semiconductor substrate, another semiconductor substrate is bonded to the side of the semiconductor substrate with an insulation film buried in, and the semiconductor substrates are etched with the oxide film buried in the semiconductor substrate as a mask to thereby form a torsion bar integral with the semiconductor substrates, whereby the thickness of the torsion bar can be easily controlled. Thus, according to the present invention, a micro machine having a torsion bar can be fabricated with high yields.

According to the present invention, through-holes which function as alignment marks are formed respectively in the semiconductor substrates, whereby the semiconductor substrates can be easily aligned. Thus, according to the present invention, micro machines can be fabricated by using simple fabrication systems, which contributes to low costs.

DETAILED DESCRIPTION OF THE INVENTION

[A First Embodiment]

Figure 1A:
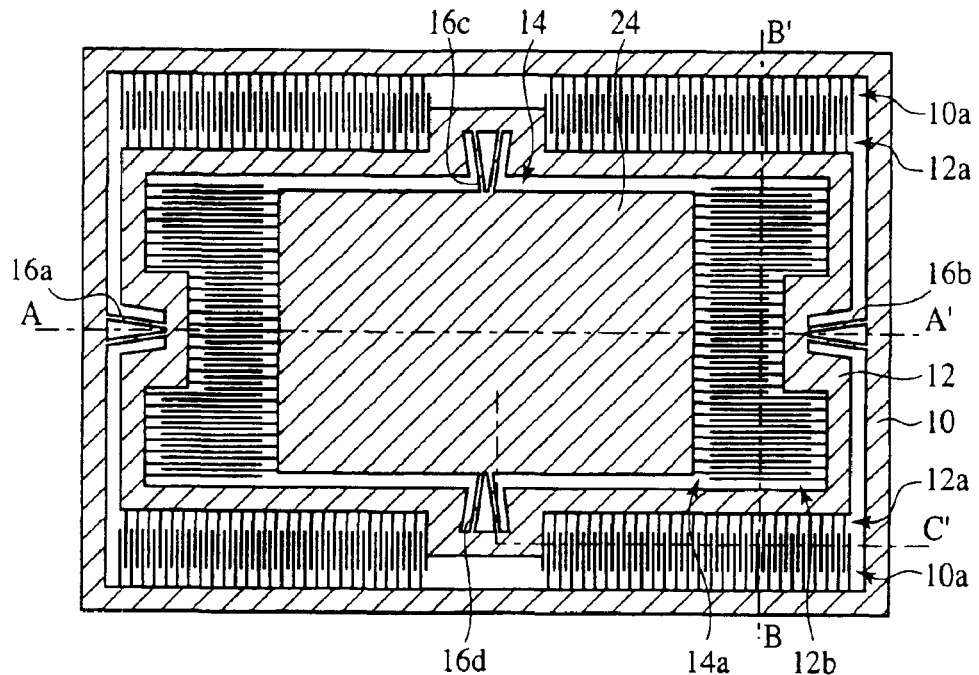
FIGS. 1A to 1C are a plan view and sectional views of the micro machine according to a first embodiment of the present invention.
Figure 1B:
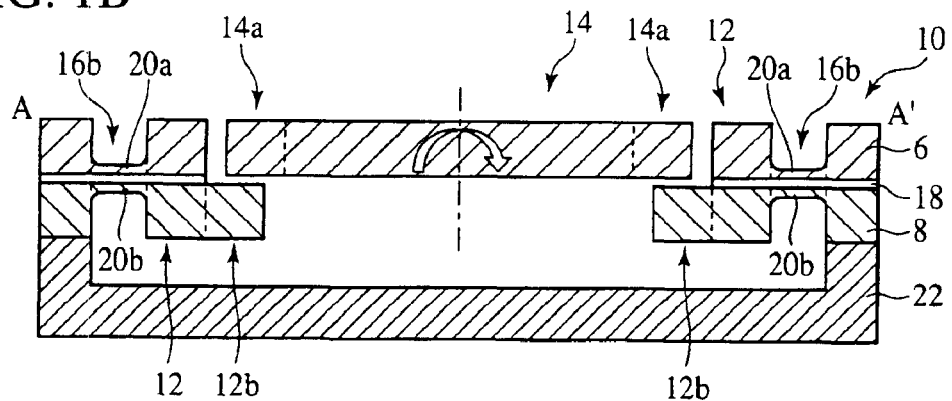
Figure 1C:
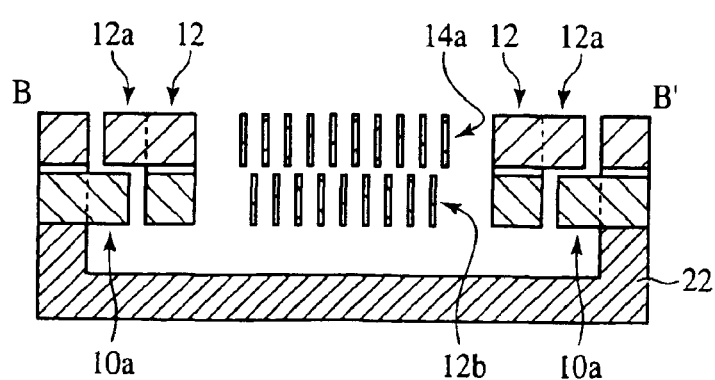
Figure 2:
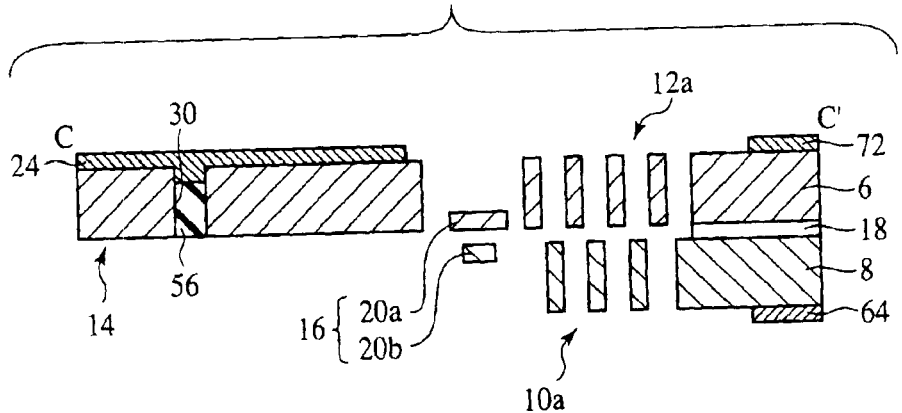
FIG. 2 is a sectional view of the micro machine according to the first embodiment of the present invention.

A micro machine according to a first embodiment of the present invention and a method for fabricating the micro machine will be explained with reference to FIGS. 1 to 9C. FIGS. 1A to 1C are a plan view and sectional views of the micro machine according to the present embodiment. FIG. 2 is a sectional view of the micro machine according to the present embodiment. FIGS. 3A to 9C are sectional views of the micro machine according to the present embodiment in the steps of the method for fabricating the micro machine, which show the method.

In the present embodiment, the principle of the present invention is applied to the method for fabricating an optical switch, but the principle of the present invention is not essentially applied to the fabrication method for optical switches but is applicable to a fabrication method for any other micro machine.

(The Micro Machine)

The micro machine according to the present embodiment will be explained with reference to FIGS. 1A to 2. FIG. 1A is a plan view of the micro machine according to the present embodiment. FIG. 1B is the sectional view along the line A–A' in FIG. 1A. FIG. 1C is the sectional view along the line B–B' in FIG. 1A. FIG. 2 is the sectional view along the line C–C' in FIG. 1A.

As shown in FIGS. 1A to 1C, the micro machine according to the present embodiment comprises a frame-shaped stationary electrode 10, a frame-shaped movable electrode 12 formed inside the stationary electrode 10, a sheet-shaped movable electrode 14 formed inside the movable electrode 12, and torsion bars 16 which rotatably supports the movable electrodes 12, 14.

The stationary electrode 10, the movable electrodes 12, 14, and the torsion bars 16 are formed by suitably etching two sheets of silicon substrates 6, 8 which are bonded to each other with a silicon oxide film 18 therebetween.

The movable electrode 12 is supported by the stationary electrode 10 by means of the torsion bars 16a, 16b, which are formed respectively on the left side and the right side of the drawing of the movable electrode 12. The movable electrode 12 can be rotated on the axis which is the line interconnecting the torsion bar 16a and the torsion bar 16b, i.e., can make a seesaw motion (partial rotary motion).

The movable electrode 14 is secured to the movable electrode 12 by means of the torsion bars 16c, 16d, which are respectively formed on the upper side and the lower side of the drawing of the movable electrode 14. The movable electrode 14 can be rotated on the axis which is the line interconnecting the torsion bar 16c and the torsion bar 16d.

The torsion bar 16 is formed of a couple of spring portions 20a, 20b which are opposed to each other. The spring portion 20a is formed by etching the silicon substrate 6 and is integral with the silicon substrate 6. The spring 20b is formed by etching the silicon substrate 8 and is integral with the silicon substrate 8.

The torsion bar 16 is constituted by the couple of spring portions 20a, 20b here but may be constituted with one spring portion.

The stationary electrode 10 is fixed to a base substrate 22.

The stationary electrode 10 has digital portions 10a. The digital portions 10a are formed inside the stationary electrode 10. Patterning the silicon substrate 8 in digits forms the digital portions 10a.

The movable electrode 12 has digital portions 12a, 12b. The digital portions 12a, 12b are formed respectively inside and outside the movable electrode 12. Patterning the silicon substrate 6 in digits forms the digital portions 12a outside the movable electrode 12. Patterning the silicon substrate 8 in digits forms the digital portions 12b formed inside the movable electrode 12.

The movable electrode 14 has digital portions 14a. The digital portions 14a are formed outside the movable electrode 14. Patterning the silicon substrate 6 in digits forms the digital portions 14a.

The digital portions 10a and the digital portions 12a are formed so that the digits of them are opposed each other.

The digital portions 12b and the digital portion 14a are formed so that digit portions of them are opposed each other.

The digital portions 10a, 12a, 12b, 14a are formed respectively in the stationary electrode 10 and the movable electrodes 12, 14 so that the stationary electrode 10 and the movable electrode 12, and the movable electrode 12 and the movable electrode 14 are opposed at larger areas.

A mirror 24 for reflecting light is formed in the movable electrode 14.

As shown in FIG. 2, bumps 64, 72 for applying voltage to the stationary electrode 10 are formed on the stationary electrode 10. Bumps (not shown) for applying voltages to the movable electrodes 12, 14 are also formed respectively on the movable electrodes 12, 14.

As shown in FIG. 2, a through-hole 30 which has been used in aligning the silicon substrate 6 and the silicon substrate 8 is present in the movable electrode 14. The through-hole 30 is filled with a buried layer 56.

Thus, the micro machine according to the present embodiment is constituted.

The micro machine according to the present embodiment which is thus constituted can suitably rotate the movable electrode 12 by suitably applying voltage between the stationary electrode 10 and the movable electrode 12, and by suitably applying voltage between the stationary electrode 10 and the movable electrode 14, the movable electrode 14 can be suitably rotated. Thus, the micro machine according to the present embodiment can set a suitable tilt of the mirror 24, so that light incident on the mirror 24 can be reflected in a required direction. That is, the micro machine according to the present embodiment can function as an optical switch which can suitably change an optical path.

(The Method for Fabricating the Micro Machine)

Next, the method for fabricating the micro machine according to the present embodiment will be explained with reference to FIGS. 3A to 9C.

Figure 3A:
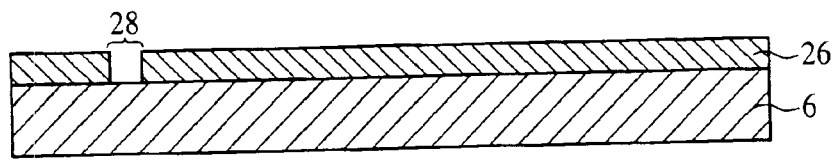
FIGS. 3A to 3E are sectional views of the micro machine according to the first embodiment of the present invention in the steps of the method for fabricating the micro machine, which show the method (Part 1).

First, as shown in FIG. 3A, a silicon substrate 6 of, e.g., a 100 μm-thickness is prepared.

Then, a photoresist film 26 is formed on the entire surface by spin coating. Before the photoresist film 26 is formed, the silicon substrate 6 may be numbered. The silicon substrate 6 is numbered, which facilitates identifying the silicon substrate 6 and the upper surface and the under surface of the silicon substrate 6.

Next, the photoresist film 26 is patterned by photolithography to form an opening 28 in the photoresist film 26 down to the silicon substrate 6. The opening 28 is for forming the through-hole 30 in the silicon substrate 6 (see FIG. 3B)

Figure 3B:
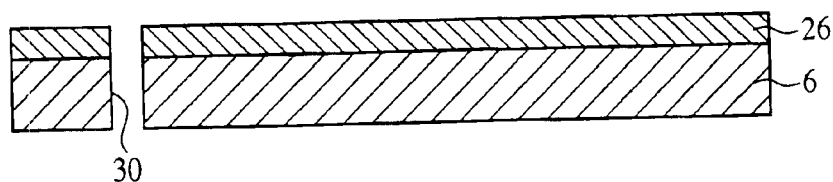

Then, as shown in FIG. 3B, with the photoresist film 26 as a mask, the silicon substrate 6 is etched by, e.g., dry etching. Thus, the through-hole 30 is formed in the silicon substrate 6. The through-hole 30 functions as the alignment mark when the silicon substrate 6 and the silicon substrate 8 are adhered to each other in a later step.

Then, the photoresist film 26 is removed.

Figure 3C:
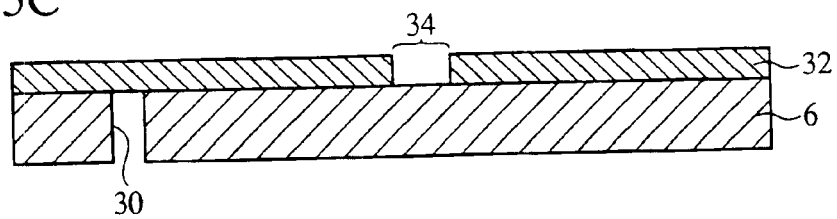

Next, as shown in FIG. 3C, the photoresist film 32 is formed on the entire surface by, e.g., spin coating.

Then, the photoresist film 32 is patterned by photolithography. In this etching, the through-hole 30 is used as the alignment mark. Thus, the opening 34 down to the silicon substrate 6 is formed. The opening 34 is for implanting oxygen ions into the silicon substrate 6.

Figure 3D:
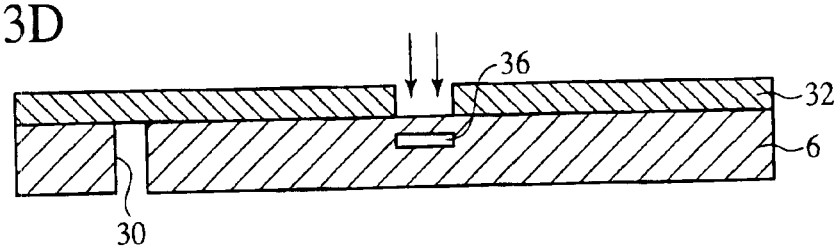

Next, as shown in FIG. 3D, with the photoresist film 32 as a mask, oxygen ions are implanted into the silicon substrate 6 by ion implantation. Ion implanting conditions are e.g., a 200 keV acceleration energy and a $2\times10^{18}$ cm$^{-2}$ dose. The oxygen ions are implanted in a region 36 which is 3 μm-deep from the surface of the silicon substrate 6. The acceleration energy and the dose for the ion implantation are suitably set, whereby the film thickness and the depth of the silicon oxide film 36 formed in the silicon substrate 6 are suitably set (see FIG. 3E).

A silicon layer (not shown) may be further formed on the silicon substrate 6 with oxygen ions implanted, whereby the silicon oxide film 38 can be buried at a required depth. As the silicon layer on the silicon substrate 6 a polysilicon layer may be deposited, or a silicon layer of good crystalline may be epitaxially grown.

Figure 3E:
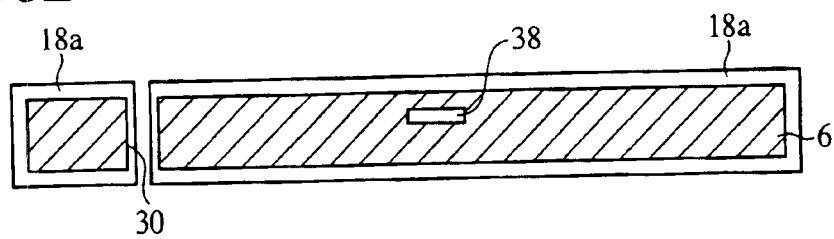

Then, as shown in FIG. 3E, thermal processing is performed in an oxidizing atmosphere. Thus, the silicon oxide film 38 of, e.g., a 1 μm-thickness is formed in the region 36 where oxygen ions have been implanted. In other words, the silicon oxide film 38 is buried in the region which is 3 μm deep from the surface of the silicon substrate 6. The silicon oxide film 18a is formed also on the surface of the silicon substrate 6 and the inside wall of the through-hole 30.

Next, a silicon substrate 8 is prepared. The silicon substrate 8 can be the same as the silicon substrate 6.

Figure 4A:
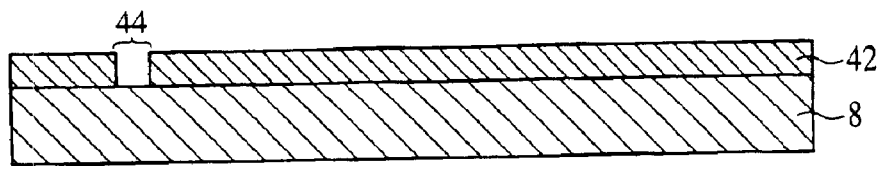
FIGS. 4A to 4E are sectional views of the micro machine according to the first embodiment of the present invention in the steps of the method for fabricating the micro machine, which show the method (Part 2).

Then, in the same way as in the step of the micro machine fabrication method described above with reference to FIG. 3A, a photoresist film 42 is formed, and then an opening 44 is formed in the photoresist film 42 (see FIG. 4A).

Figure 4B:
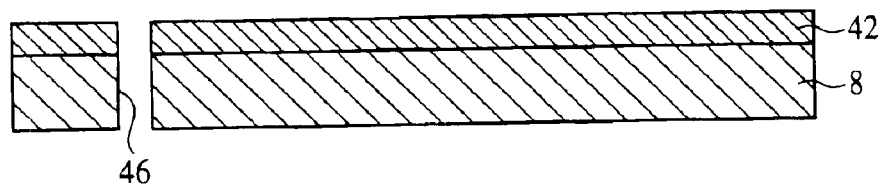

Next, in the same way as in the step of the micro machine fabrication method described above with reference to FIG. 3B, a through hole 46 is formed in the silicon substrate 8 (see FIG. 4B).

Figure 4C:
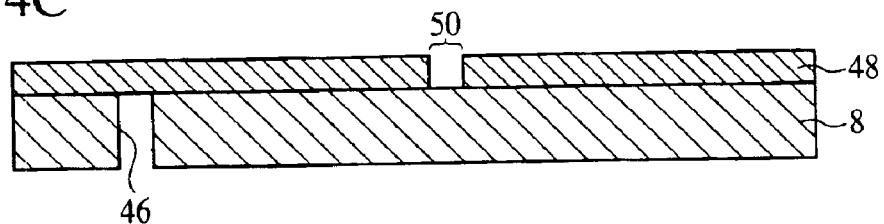

Then, in the same way as in the step of the micro machine fabrication method described above with reference to FIG. 3C, the photoresist film 48 is formed on the silicon substrate 8, and an opening 50 is formed in the photoresist film 48 (see FIG. 4C).

Figure 4D:
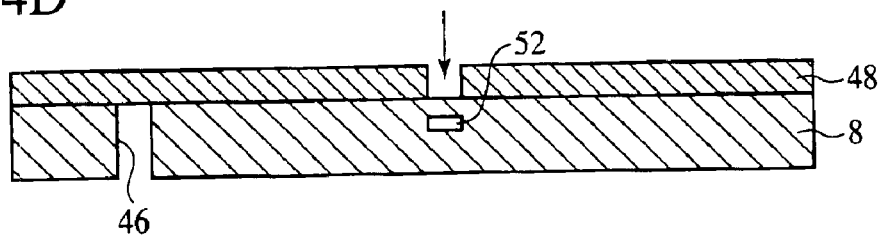

Next, in the same way as in the step of the micro machine fabrication method described above with reference to FIG. 3D, with the photoresist film 48 as a mask, oxygen ions are implanted in a region which is, e.g., 3 μm deep from the surface of the silicon substrate 8 (see FIG. 4D).

A silicon layer (not shown) may be further formed on the silicon substrate 8 with oxygen ions implanted in, whereby the silicon oxide film 56 can be buried at a required depth.

Figure 4E:
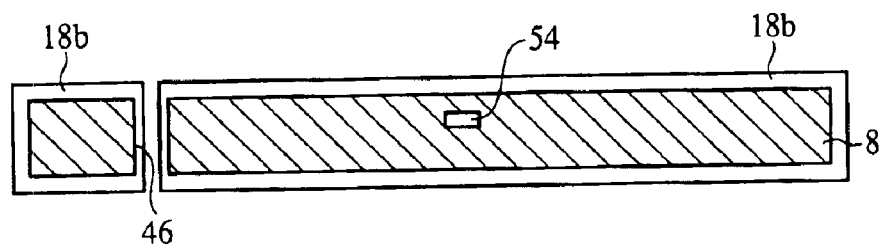

Then, in the same way as in the step of the micro machine fabrication method described above with reference to FIG. 3E, a silicon oxide film 54 is formed in the silicon substrate 8 while a silicon oxide film 18b is formed on the surface of the silicon substrate 8 and the inside wall of the through-hole 46 (see FIG. 4E).

Figure 5A:
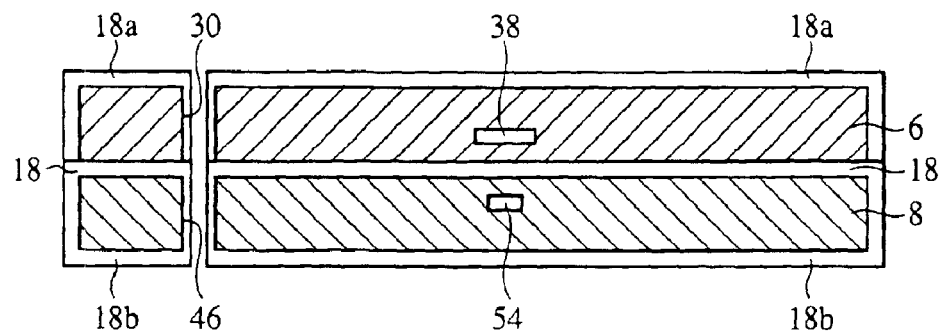
FIGS. 5A to 5D are sectional views of the micro machine according to the first embodiment of the present invention in the steps of the method for fabricating the micro machine, which show the method (Part 3).

Then, as shown in FIG. 5A, the surface of the silicon substrate 6 where the silicon oxide film 38 buried in, and the surface of the silicon substrate 8 where the silicon oxide film 54 is buried in are laid the former on the latter. In laying the silicon substrates 6, 8 former on the latter, the through-holes 30, 46 are used as alignment marks.

Then, thermal processing is performed. Conditions for the thermal processing are, e.g., 1300° C. and 8 hours. Thus, the silicon substrate 6 and the silicon substrate 8 are bonded to each other with the silicon oxide film 18 therebetween.

Figure 5B:
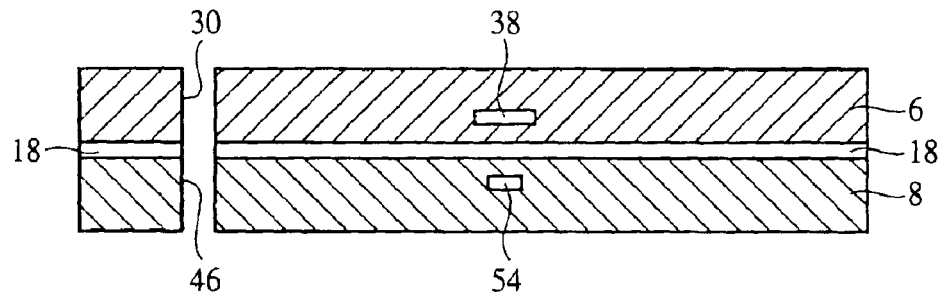

Then, as shown in FIG. 5B, the silicon oxide films 18a, 18b on the surfaces of the silicon substrates 6, 8 are removed by using hydrofluoric acid.

Figure 5C:
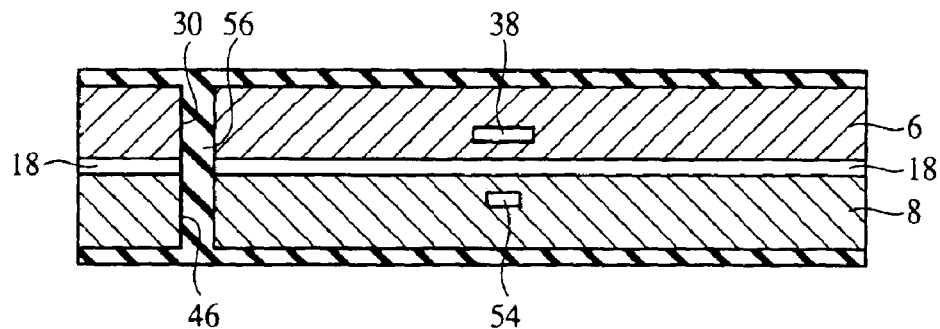

Next, as shown in FIG. 5C, a buried layer 56 of, e.g., polysilicon is formed in the through-holes 30, 46 by, e.g., CVD. At this time, the buried layer 56 is formed also on the upper surface of the silicon substrate 6 and the under surface of the silicon substrate 8.

The buried layer 56 buried in the through-holes 30, 46 is polysilicon here. However, the buried layer 56 is not essentially polysilicon but can be, e.g., amorphous silicon or others. The buried layer 56 can be polysilicon, amorphous silicon or others with a dopant, such as P (phosphorus) implanted in. The buried layer 56 is not limited to semiconductors but can be an insulation film, such as silicon oxide film, silicon nitride film or others.

Figure 5D:
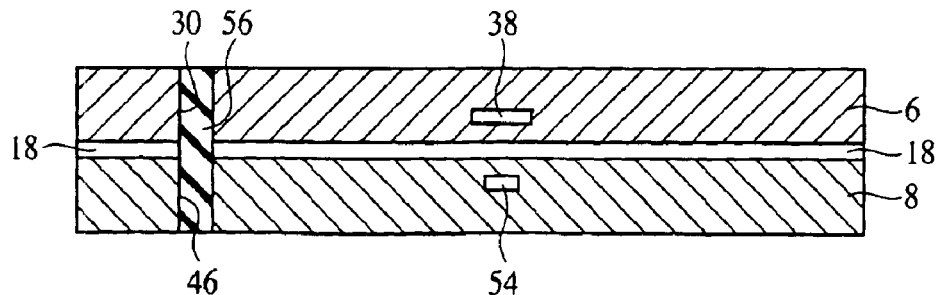

Then, as shown in FIG. 5D, the buried layer 56 formed on the upper surface of the silicon substrate 6 and on the under surface of the silicon substrate 8 is removed by, e.g., CMP (Chemical Mechanical Polishing). Thus, the buried layer 56 is buried in the through-holes 30, 46.

The buried layer 56 is buried in the through-holes 30, 46 for the prevention of intrusion of unnecessary foreign objects into the through-holes 30, 46. That is, unnecessary foreign objects which may intrude into the through-holes 30, 46 will adhere to parts to be processed in photolithography, etching, etc. of later steps resultantly impair the processing. In the present embodiment, the buried layer 56 buried in the through-holes 30, 46 can prohibit the foreign objects from intruding into the through-holes 30, 46. Resultantly, the adhesion of foreign objects to parts to be processed can be prevented, and accordingly the impair of the processing in the photolithography and etching can be prevented.

Figure 6A:
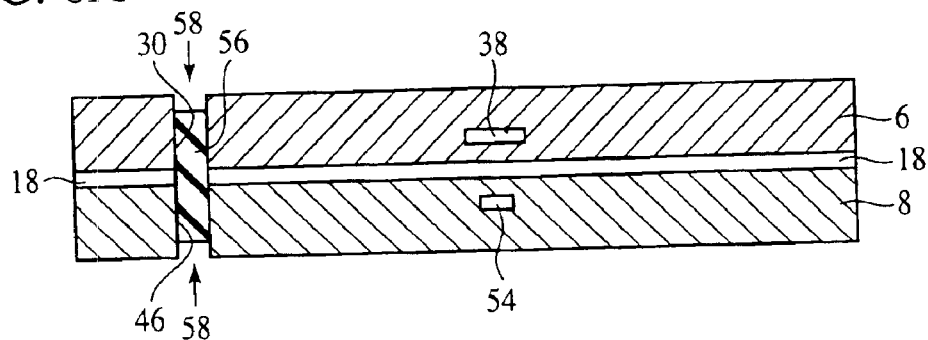
FIGS. 6A to 6D are sectional views of the micro machine according to the first embodiment of the present invention in the steps of the method for fabricating the micro machine, which show the method (Part 4).
Figure 6B:
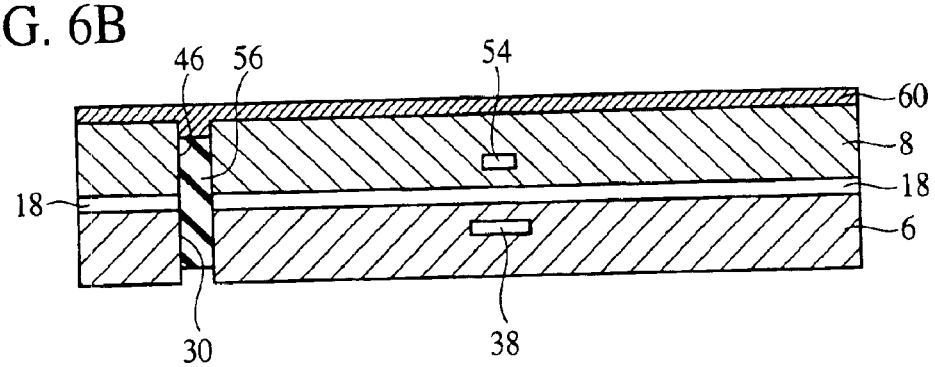

Then, as shown in FIG. 6A, upper portion and lower portion of the buried layer 56 buried in the through-holes 30, 40 are etched by, e.g., wet etching. Concavities 58 are thus formed in the etched parts of the buried layer 56. The depth of the concavities 58 is, e.g., about 3 μm. The concavities 58 are formed because the through-holes 30, 40 are completely filled with the buried layer 56 will be difficult to identify as the alignment marks. The thus formed concavities 58 function as the alignment marks.

The buried layer 56 on the upper surface of the silicon substrate 6 and on the under surface of the silicon substrate 8 is removed here by CMP but may not be removed essentially by CMP, and may be removed by etching. When the buried layer 56 is removed by etching, care must be taken not to excessively remove the buried layer 56 in the through-holes 30, 46.

Then, as shown in FIG. 6A, the silicon substrates 6, 8 are turned over, and then a 50 nm-thickness Cr film and a 200 nm-thickness Au film are deposited on the entire surface of the silicon substrate 8 by, e.g., sputtering. A metal film 60 formed of the Cr film and the Au film is formed. The silicon substrates 6, 8 are turned over so as to form the bump 62 (see FIG. 6C) for applying voltage to the stationary electrode 10 (see FIGS. 1A to 1C) in the side of the silicon substrate 8.

Then, a photoresist film 62 is formed on the entire surface by spin coating. Then, the photoresist film 62 is patterned by photolithography. Thus, the photoresist film 62 for patterning a metal film 60 is formed.

Figure 6C:
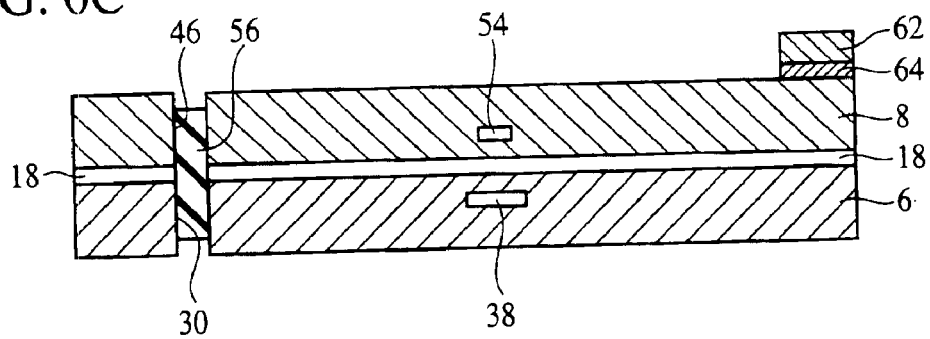

Then, as shown in FIG. 6C, with the photoresist film 62 as a mask, the metal film 60 is etched. Thus, the bump 64 is formed of the metal film 60 is formed.

Figure 6D:
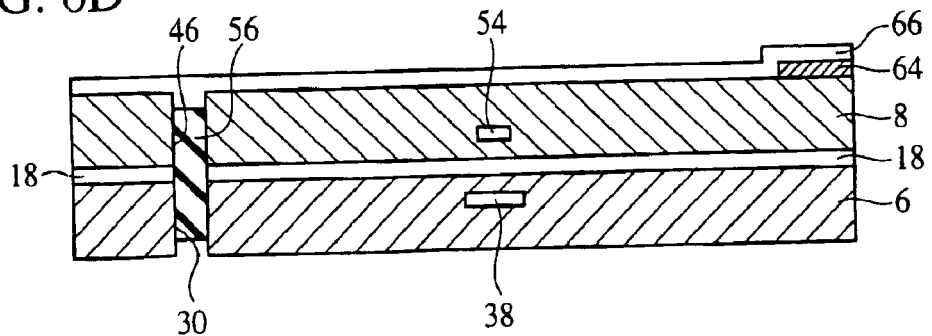

Next, as shown in FIG. 6D, a 1 μm-thickness silicon oxide film 66 is formed on the entire surface by, e.g., plasma TEOS-CVD. The silicon oxide film 66 is for protecting the bump 64. Here, plasma TEOS-CVD is used to form the silicon oxide film 66 because plasma TEOS-CVD allows the silicon oxide film 66 to be formed on only one side of the silicon substrate 8. Plasma TEOS-CVD allows the silicon oxide film 66 to be formed at a temperature below 400° C. Plasma TEOS-CVD is used here no to affect the surface of the bump 64.

The silicon oxide film 66 is formed here by plasma TEOS-CVD but may not be formed essentially by plasma TEOS-CVD. The silicon oxide film 66 may be formed by CVD using, e.g., $SiH_4$ as a raw material gas.

Figure 7A:
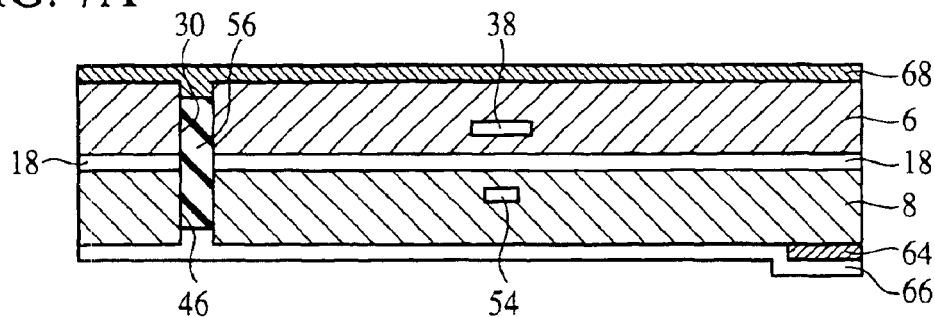
FIGS. 7A to 7D are sectional views of the micro machine according to the first embodiment of the present invention in the steps of the method for fabricating the micro machine, which show the method (Part 5).

Then, as shown in FIG. 7A, the silicon substrates 6, 8 are turned over.

Next, a 50 nm-film thickness Cr film and a 200 nm-film thickness Au film are sequentially deposited on the entire surface by, e.g., sputtering. Thus, a metal film 68 is formed of the Cr film and the Au film. The metal film 68 is to form the mirror 24 and the bump 72 (see FIG. 7B).

Figure 7B:
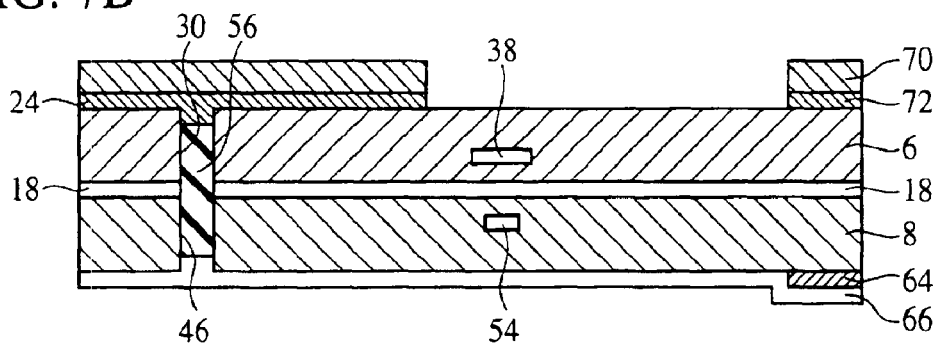
Figure 7C:
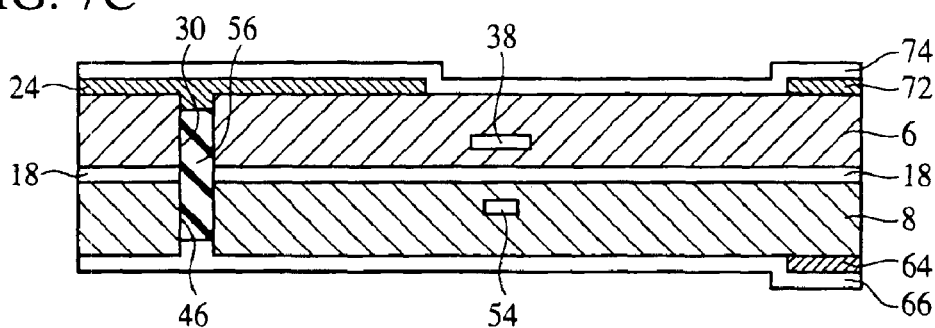
Figure 7D:
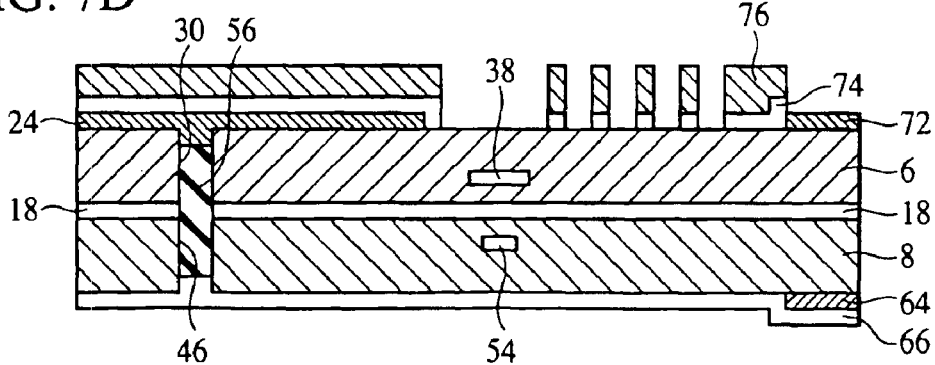

Then, as shown in FIG. 7B, a photoresist film 70 is formed on the entire surface by, e.g., spin coating. Then, the photoresist film 70 is patterned by photolithography.

Next, with the photresist film 70 as a mask, the metal film 68 is patterned. Thus, the mirror 24 and the bump 72 formed of the metal film 68 are formed.

Then, a 1 $\mu$m-film thickness silicon oxide film 74 is formed on the entire surface by, e.g., plasma TEOS-CVD. The silicon oxide film 74 is for protecting the mirror 24 and the bump 72. Here, plasma TEOS-CVD is used in forming the silicon oxide film 74 for the same reason as in forming the silicon oxide film 66.

Next, a photoresist film 76 is formed on the entire surface by, e.g., spin coating. Then, the photoresist film 76 is patterned by photolithography.

Then, with the photoresist film 76 as a mask, the silicon oxide film 74 is etched. The patterned silicon oxide film 74 functions as a hard mask in patterning the silicon substrate 6 to form the digital portions 12a of the movable electrode 12 and the spring portions 20a constituting the torsion bar 16. When the silicon oxide film 74 is patterned, the silicon oxide film 74 must be patterned to open at least the region where the silicon oxide film 20a is formed and both regions on both sides of the region with the silicon oxide film 20a is formed.

Figure 8A:
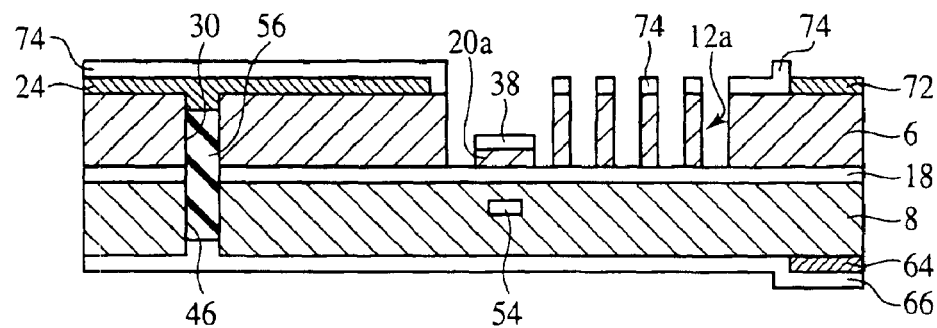
FIGS. 8A to 8C are sectional views of the micro machine according to the first embodiment of the present invention in the steps of the method for fabricating the micro machine, which show the method (Part 6).

Next, as shown in FIG. 8A, with the silicon oxide films 38, 74 as a mask and with the silicon oxide film 18 as an etching stopper, the silicon substrate 6 is etched by D-RIE (Deep Reactive ion Etching) The silicon substrate 6 is etched, repeating the etching step and the protection film depositing step.

Preferably, the etching of the silicon substrate 6 is started with the protection film depositing step in consideration of reducing the undercut of the silicon substrate 6 directly below the silicon oxide film 74.

The etching step is performed in the following conditions. The etching time is, e.g., 8+0 seconds. The figure after "+" is a time in which the etching step overlaps the protection film depositing step. The gas to be fed into the etching chamber is, e.g., $SF_6$. The flow rate of the $SF_6$ gas is, e.g., 100 sccm. The pressure in the chamber is, e.g., 12 mTorr. The electric power to be applied to the coil is, e.g., 800 W, and the bias power is, e.g., 15 W.

The protection film depositing step is performed in the following conditions. The protection film depositing time is, e.g., 6+0.5 seconds. The figure after "+" is a time in which the protection film depositing step overlaps the etching step. The gas to be fed into the etching chamber is, e.g., $C_4F_8$. The flow rate of the $C_4F_8$ is, e.g., 80 sccm. The pressure in the chamber is, e.g., 8 mTorr. The electric power to be applied to the coil is, e.g., 800 W, and the bias power is, e.g., 0 W.

As for the pressure in the chamber, the APC (Auto Pressure Controller) valve may be set fixed. In the above, the electric power to be applied to the coil in the etching step and the electric power to be applied to the coil in the protection film depositing step are set equal to each other. The electric power to be applied to the coil in the etching step and that to be applied to the coil in the protection depositing step may be different from each other.

Thus, etching the silicon substrate 6 by D-RIE forms the digital portions 12a of the movable electrode 12 and forms the spring portions 20a of, e.g., a 3 $\mu$m-thickness between the silicon oxide film 38 and the silicon oxide film 18.

Figure 8B:
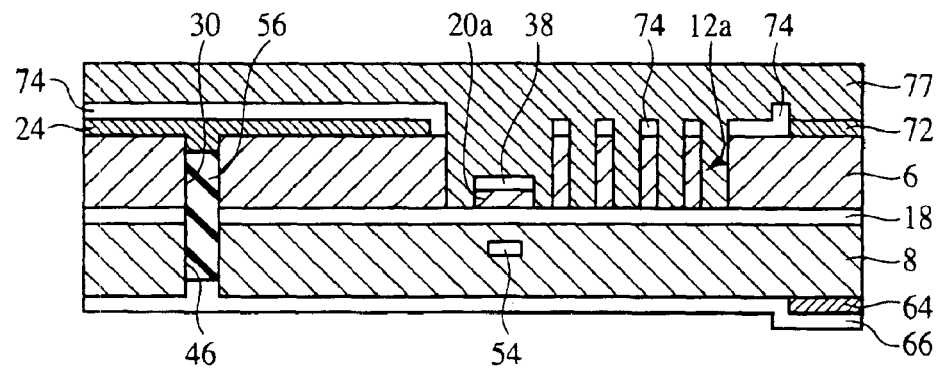

Then, as shown in FIG. 8B, a protection film 77 of polyimide or resist is formed on the entire surface by, e.g., spin coating. The protection film 77 is for protecting the digital portions 20a, etc. When the protection film 77 is formed of resist, the resist can be, e.g., negative resist.

As required, the following steps may be performed with the silicon substrate 6 securely bonded to the other substrate (not shown) at the side thereof with the protection film 77 formed on.

Figure 8C:
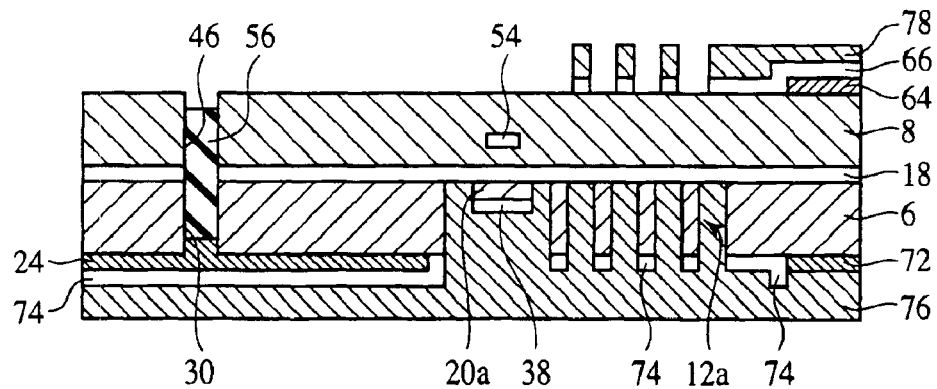

Then, as shown in FIG. 8C, the silicon substrates 6, 8 are turned over.

Next, a photoresist film 78 is formed on the entire surface by, e.g., spin coating. Then, the photoresist film 78 is patterned by photolithography.

Then, with the photoresist film 78 as a mask, the silicon oxide film 66 is etched. The patterned silicon oxide film 66 acts as a hard mask when the silicon substrate 8 is patterned to form the digital portions 10a of the stationary electrode 10 and the spring portions 20b constituting the torsion bar 16, etc. In patterning the silicon oxide film 66 the silicon oxide film 66 must be patterned to open at least the region where the silicon oxide film 54 is formed and both regions on both sides of the region where the silicon oxide film 54 is formed.

Figure 9A:
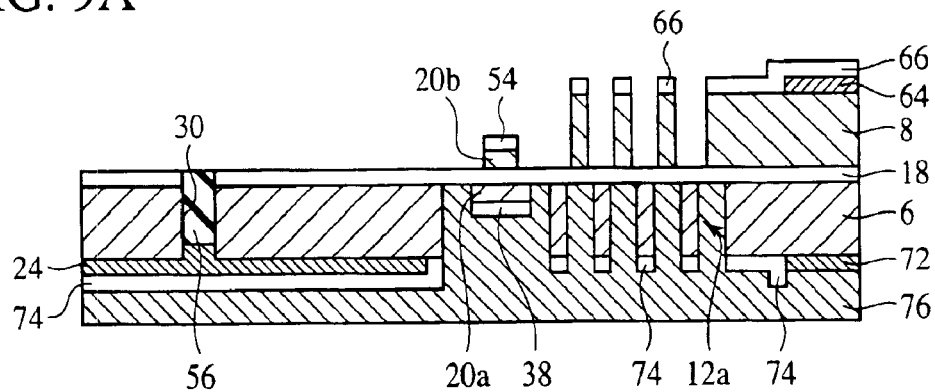
FIGS. 9A to 9C are sectional views of the micro machine according to the first embodiment of the present invention in the steps of the method for fabricating the micro machine, which show the method (Part 7).

Then, as shown in FIG. 9A, with the silicon oxide films 54, 66 as a mask and the silicon oxide film 18 as an etching stopper, the silicon substrate 8 is etched by D-RIE. The etching of the silicon substrate 8 by D-RIE is performed by the same step as described above with reference to FIG. 8A.

Thus, the digital portions 10a of the stationary electrode 10 are formed, while the spring portion 20b of, e.g., a 3 $\mu$m-thickness is formed between the silicon oxide film 54 and the silicon oxide film 18.

Figure 9B:
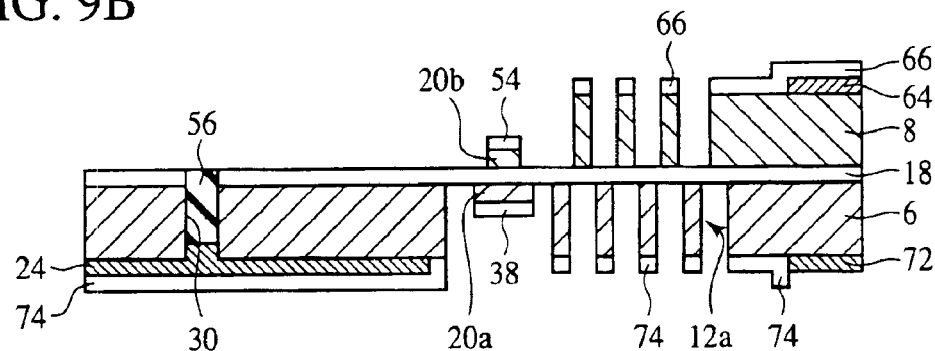

Then, as shown in FIG. 9B, the protection film 77 is removed.

Figure 9C:
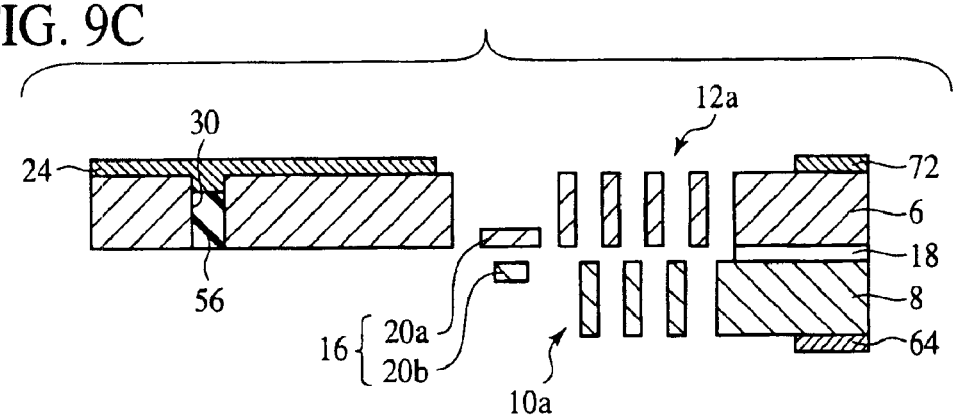

Then, as shown in FIG. 9C, the silicon substrates 6, 8 are turned over.

Next, the silicon oxide films 38, 54, 66, 74 are removed.

Thus, the micro machine according to the present embodiment is fabricated.

The buried layer 56 buried in the through-hole can be used as the alignment mark in assembling the micro machine according to the present embodiment with optical fibers, casings, etc.

The method for fabricating the micro machine according to the present embodiment is characterized mainly in that the silicon oxide films 38, 54 are buried in the silicon substrates 6, 8, the silicon substrates 6, 8 are bonded to each other at the sides thereof where the silicon oxide films 38, 54 are buried, with the silicon oxide film 18 formed therebetween, the silicon substrates 6, 8 are etched respectively with the silicon oxide films 38, 54 as masks to thereby form the spring portions 20a, 20b formed of the silicon substrates 6, 8 to form the torsion bar comprising the spring portions 20a, 20b. According to the present embodiment, the silicon oxide films 38, 54 can be buried at required depths, which facilitate controlling the thickness the spring portion 20 constituting the torsion bar 16. Thus, according to the present embodiment, the micro machine comprising the torsion bar 16 can be fabricated with high yields.

According to the present embodiment, the through-holes 30, 46, which function as alignment marks, are formed respectively in the silicon substrates 6, 8, which facilitate aligning the silicon substrates 6, 8. Thus, according to the present embodiment, the micro machine can be fabricated, using simple fabrication apparatuses, which can contribute to low costs.

[A Second Embodiment]

Figure 10:
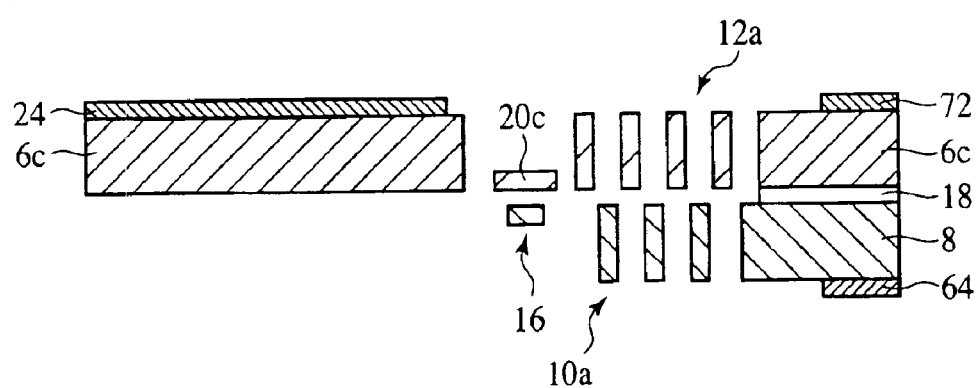
FIG. 10 is a sectional view of the micro machine according to a second embodiment of the present invention.

The micro machine according to a second embodiment of the present invention and the method for fabricating the same will be explained with reference to FIGS. 10 to 16C. FIG. 10 is a sectional view of the micro machine according to the present embodiment. FIGS. 11A to 16C are sectional views of the micro machine according to the present embodiment in the steps of the method for fabricating the micro machine, which show the method. The same members of the present embodiment as those of the micro machine according to the first embodiment and the method for fabricating the micro machine are represented by the same reference numbers not to repeat or to simplify their explanation.

First, the micro machine according to the present embodiment will be explained with reference to FIG. 10.

The micro machine according to the present embodiment is the same as the micro machine according to the first embodiment shown in FIGS. 1A to 2 except that in the former a torsion bar 16 comprises one spring portion 20c.

Then, the method for fabricating the micro machine according to the present embodiment will be explained with reference to FIGS. 11A to 16C.

Figure 11A:
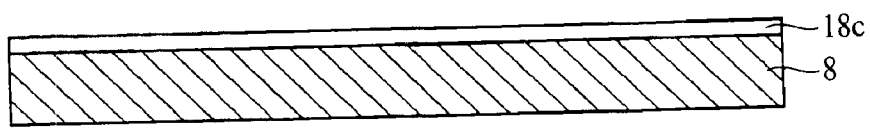
FIGS. 11A to 11D are sectional views of the micro machine according to the second embodiment of the present invention in the steps of the method for fabricating the micro machine, which show the method (Part 1).

First, a silicon substrate 8 is prepared as shown in FIG. 11A.

First, a 1 μm-thickness silicon oxide film 18c is formed on the entire surface by, e.g., CVD.

Figure 11B:
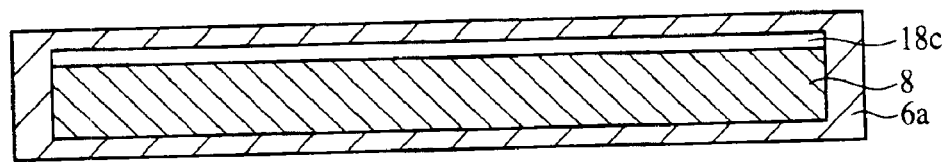

Then, as shown in FIG. 11B, a semiconductor layer 6a is formed of a 3 μm-thickness polysilicon layer on the entire surface by, e.g., CVD. The semiconductor layer 6a is formed on both surfaces.

Figure 11C:
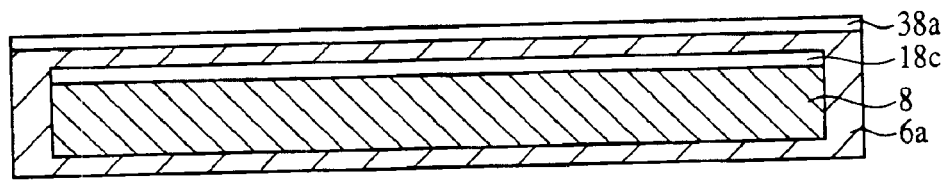

Next, as shown in FIG. 11C, a 1 μm-thickness silicon oxide film 38a is formed on the entire surface by, e.g., CVD.

Figure 11D:
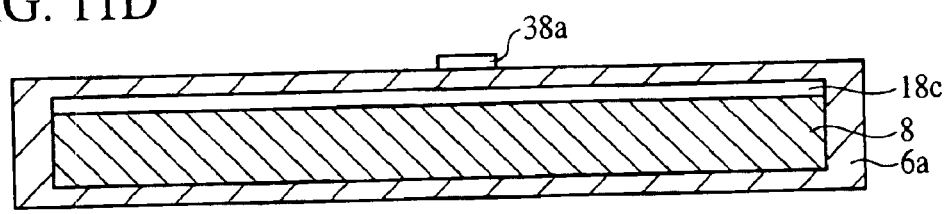

Then, as shown in FIG. 11D, the silicon oxide film 38a is patterned by photolithography. The silicon oxide film 38a acts as a hard mask in etching the semiconductor layer 6a to form the spring portion 20c of the semiconductor layer 6a.

Figure 12A:
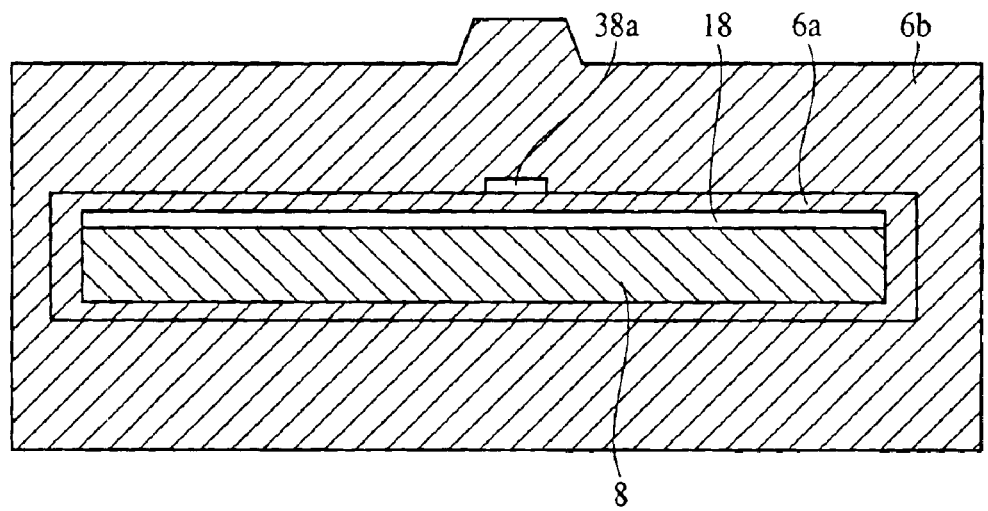
FIGS. 12A and 12B are sectional views of the micro machine according to the second embodiment of the present invention in the steps of the method for fabricating the micro machine, which show the method (Part 2).

Next, as shown in FIG. 12A, a semiconductor layer 6b is formed of a 150 μm-thickness polysilicon on the entire surface by, e.g., CVD. The semiconductor layer 6b is formed on both surfaces.

Figure 12B:
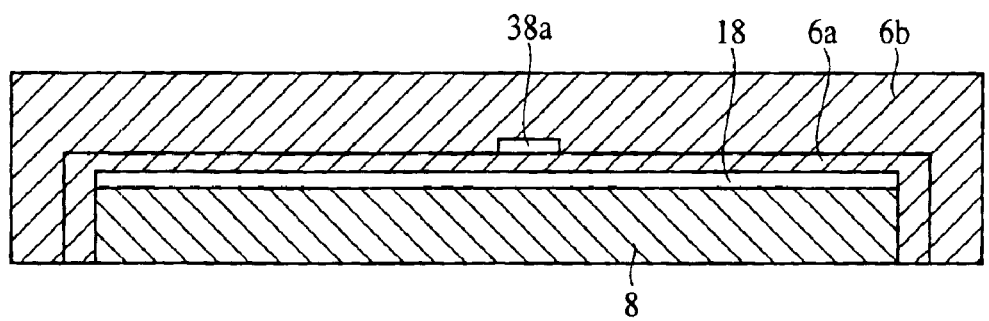

Then, as shown in FIG. 12B, the surface of the semiconductor layer 6b formed on the upper sides of the silicon substrate 8 is polished by, e.g., CMP. The surface of the semiconductor layer 6b is polished up to, e.g., an about 100 μm-total film thickness of the semiconductor layers 6a, 6b.

The semiconductor layer 6b on the underside of the silicon substrate 8 is polished by, e.g., CMP until the silicon substrate 8 is exposed.

Figure 13A:
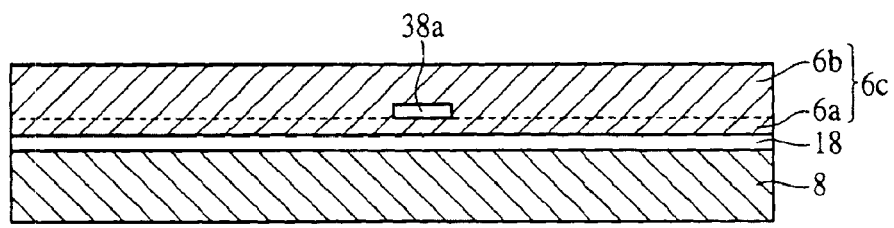
FIGS. 13A to 13C are sectional views of the micro machine according to the second embodiment of the present invention in the steps of the method for fabricating the micro machine, which show the method (Part 3).
Figure 13B:
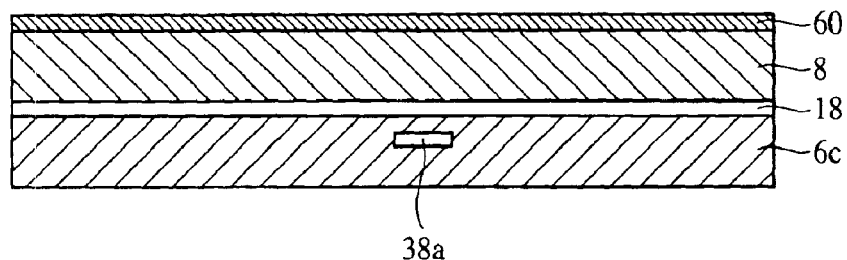
Figure 13C:
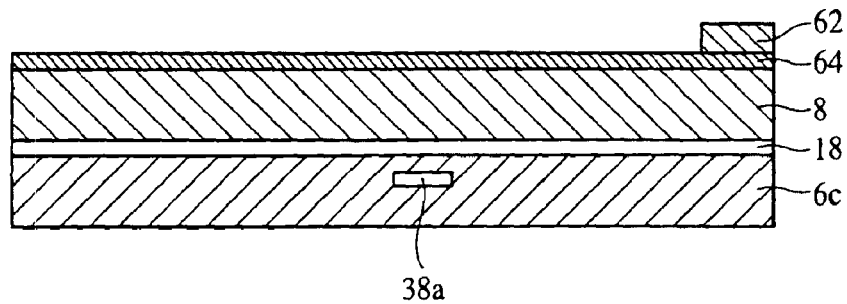
Figure 14A:
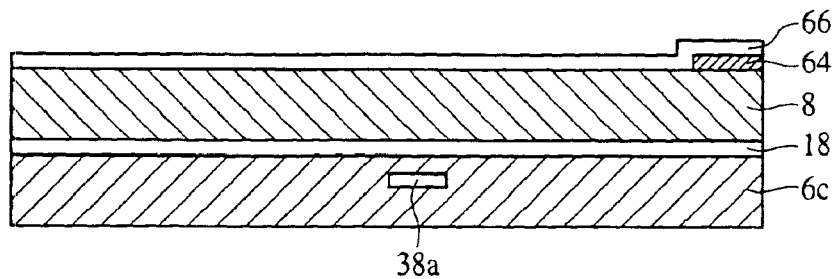
FIGS. 14A to 14D are sectional views of the micro machine according to the second embodiment of the present invention in the steps of the method for fabricating the micro machine, which show the method (Part 4).
Figure 14B:
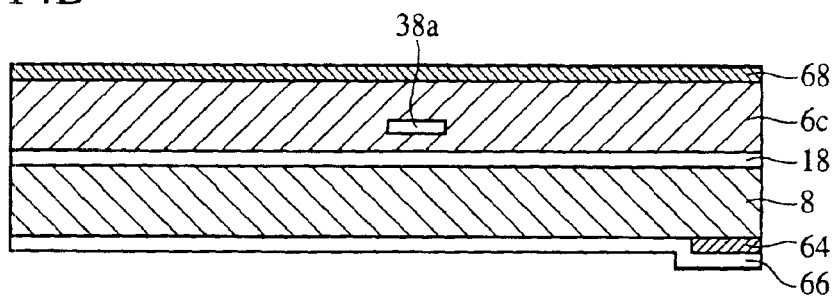
Figure 14C:
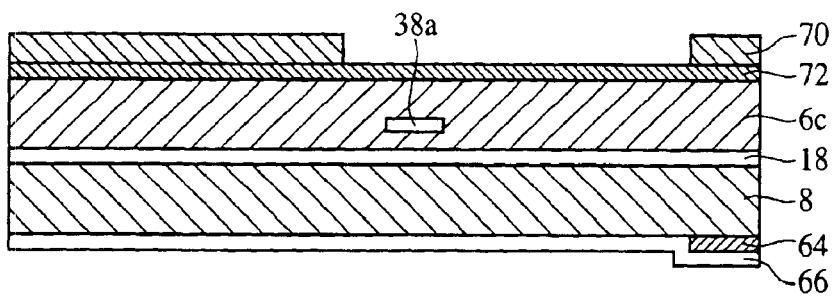
Figure 14D:
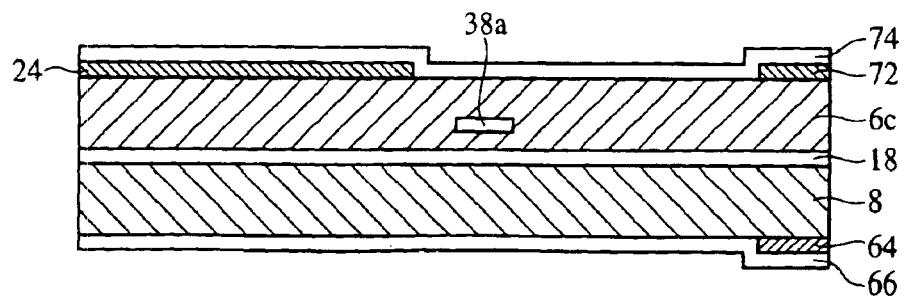
Figure 15A:
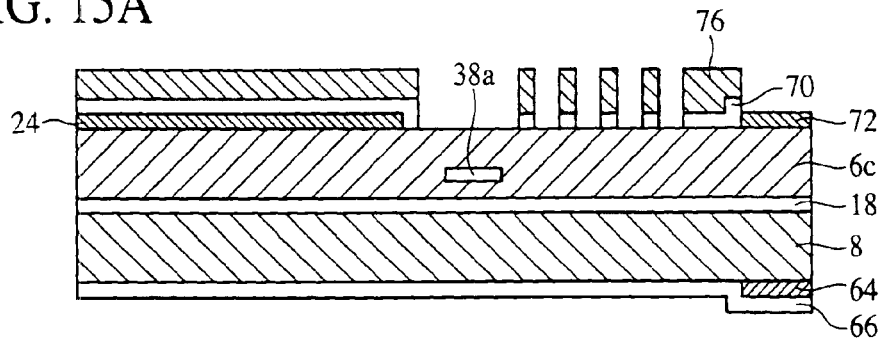
FIGS. 15A to 15D are sectional views of the micro machine according to the second embodiment of the present invention in the steps of the method for fabricating the micro machine, which show the method (Part 5).
Figure 15B:
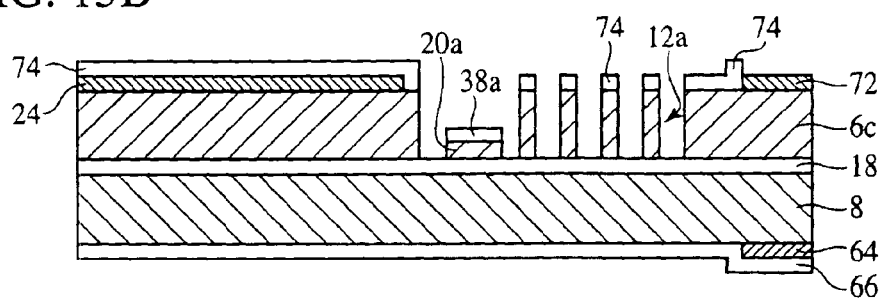
Figure 15C:
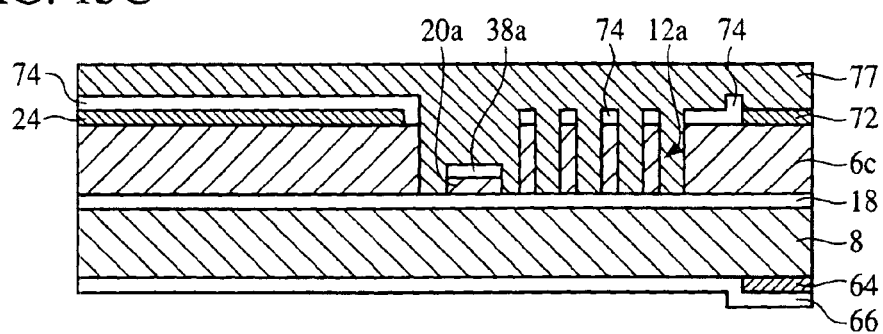
Figure 15D:
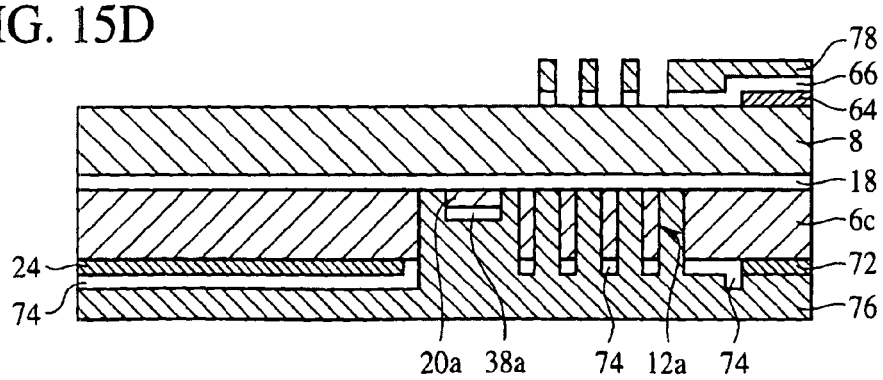
Figure 16A:
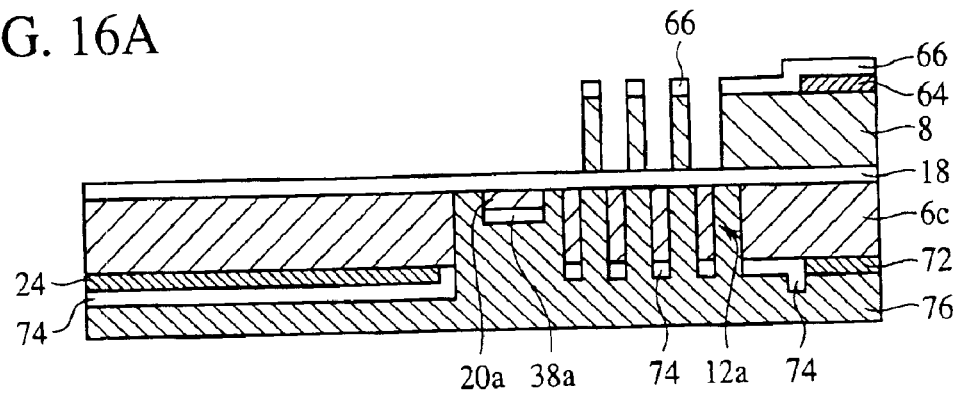
FIGS. 16A to 16C are sectional views of the micro machine according to the second embodiment of the present invention in the steps of the method for fabricating the micro machine, which show the method (Part 6).
Figure 16B:
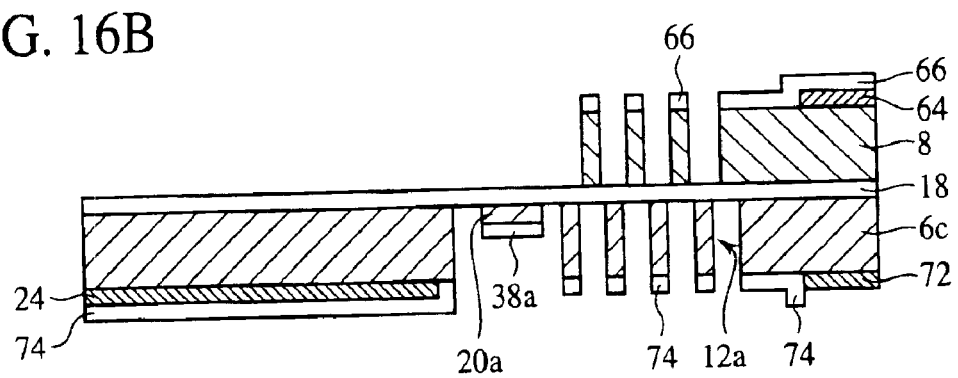
Figure 16C:
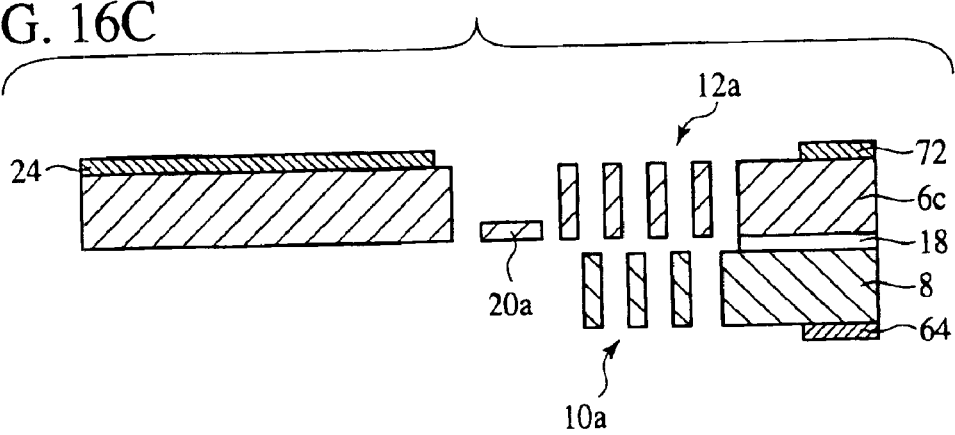

The silicon oxide film 38a is thus buried in a semiconductor layer 6c formed of the semiconductor layer 6a and the semiconductor layer 6b (see FIG. 13A).

The steps of the micro machine fabrication method shown in FIGS. 13B to 16C are the same as those of the micro machine fabricating method described above with reference to FIGS. 6B to 9C, and their explanation will not be repeated.

Thus, the micro machine according to the present embodiment is fabricated.

As described above, in the present embodiment as well, the thickness of the spring portion 20c constituting the torsion bar 16 can be easily controlled. Accordingly the present embodiment can fabricating the micro machine having he torsion bar 16 with high yields.

[A Third Embodiment]

Figure 17A:
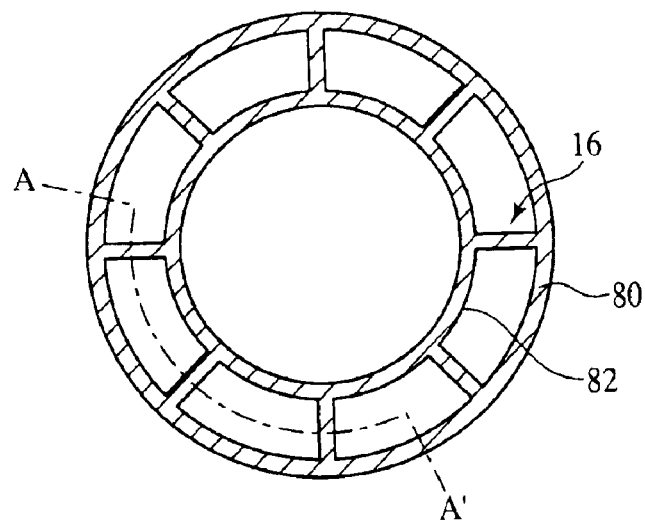
FIGS. 17A and 17B are a plan view and a sectional view of the micro machine according to a third embodiment of the present invention.
Figure 17B:
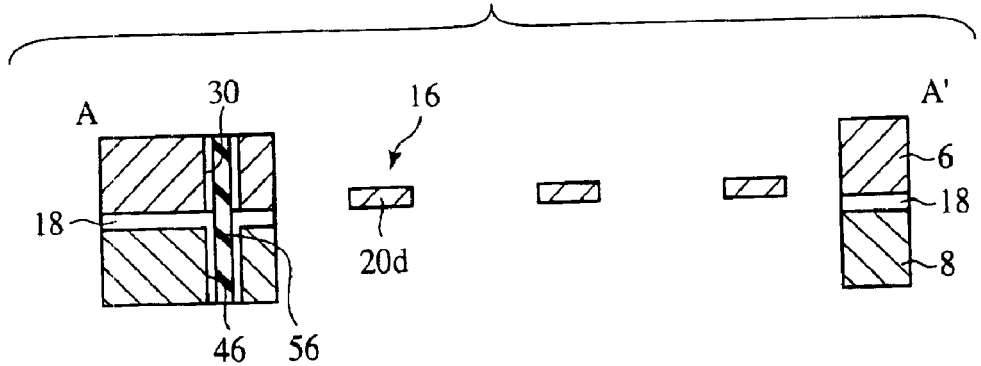

The micro machine according to a third embodiment of the present invention and the method for fabricating the micro machine will be explained with reference to FIGS. 17A to 22. FIGS. 17A and 17B are a plan view and a sectional view of the micro machine according to the present embodiment. FIGS. 18A to 22 are sectional views of the micro machine according to the present embodiment in the steps of the method for fabricating the micro machine, which show the method. The same members of the present embodiment as those of the micro machine according to the first or the second embodiment and the method for fabricating the micro machine shown in FIGS. 1 to 16C are represented by the same reference numbers not to repeat or to simplify their explanation.

In the present embodiment, the principle of the present invention is applied to a method for fabricating a resonator for use in resonant gyroscopes, etc.

The micro machine according to the present embodiment will be explained with reference to FIGS. 17A and 17B. FIG. 17A is a plan view of the micro machine according to the present embodiment. FIG. 17B is the sectional view along the line A–A' in FIG. 17A.

As shown in FIGS. 17A and 17B, a resonant ring 82 of a smaller diameter than an annular stationary frame 80, i.e., a stationary ring is formed inner of the annular stationary frame 80.

A number of torsion bars 16 are formed between the annular stationary frame 80 and the resonant ring 82. Each torsion bar 16 is formed of one spring portion 20d.

In the present embodiment, each torsion bar 16 is formed of one spring portion 20d but may be formed of a plurality of spring portions 20a, 20b as in the micro machine according to the first embodiment.

Next, the method for fabricating the micro machine according to the present embodiment will be explained with reference to FIGS. 18A to 22.

Figure 18A:
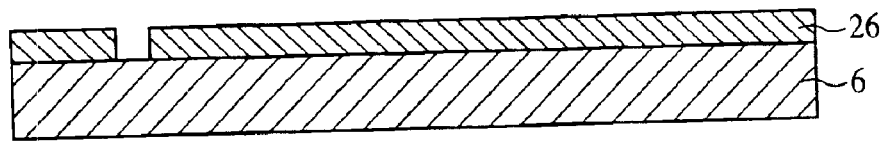
FIGS. 18A to 18E are sectional views of the micro machine according to a third embodiment of the present invention in the steps of the method for fabricating the micro machine, which show the method (part 1).

First, as shown in FIG. 18A, a silicon substrate 6 is prepared.

Figure 18B:
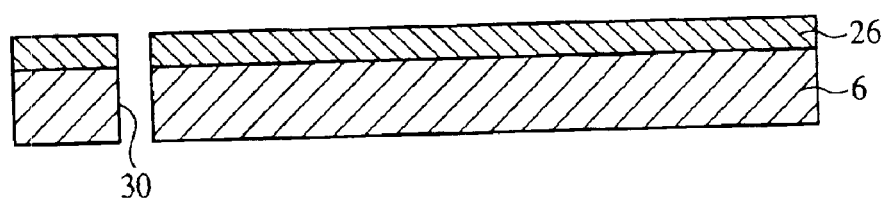

Next, in the same way as in the micro machine fabricating method described above with reference to FIG. 3B, a through-hole 30 is formed in the silicon substrate 6 (see FIG. 18B).

Figure 18C:
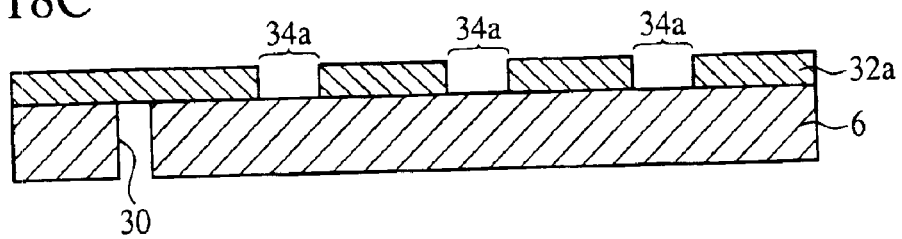

Then, as shown in FIG. 18C, a photoresist film 32a is formed on the entire surface by, e.g., spin coating.

Next, the photoresist film 32a is patterned by photolithography. Thus, openings 34a are formed down to the silicon substrate 6. The openings 34a are for implanting oxygen ions into the silicon substrate.

Figure 18D:
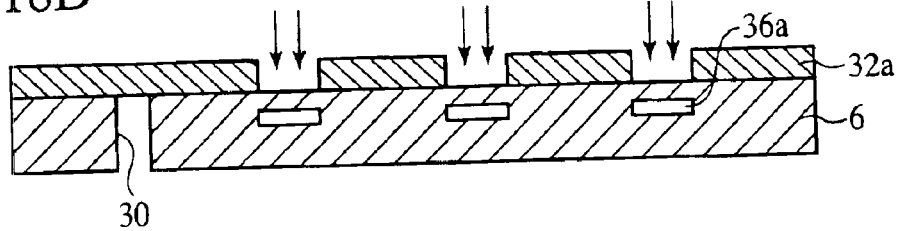
Figure 18E:
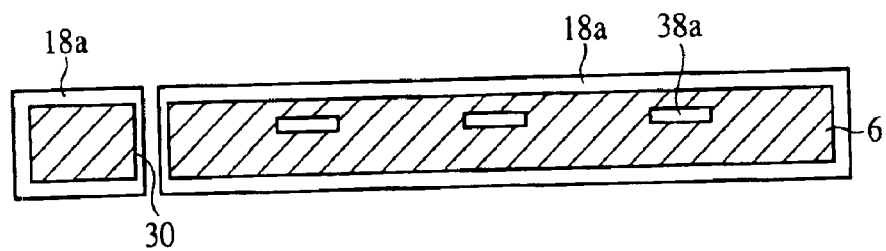

Then, in the same way as in the micro machine fabricating method described above with reference to FIG. 3D, with the photoresist film 32a as a mask, oxygen ions are implanted into a region 36a which is, e.g., 3 μm deep from the surface of the silicon substrate 6 (see FIG. 18D).

Then, in the same way as in the micro machine fabricating method described above with reference to FIG. 3E, thermal processing is performed in an oxidizing atmosphere. Such thermal processing buries a silicon oxide film 38a into the silicon substrate 6, while a silicon oxide film 18a is formed on the surface of the silicon substrate 6 and the inside wall of the through-hole 30.

Figure 19A:
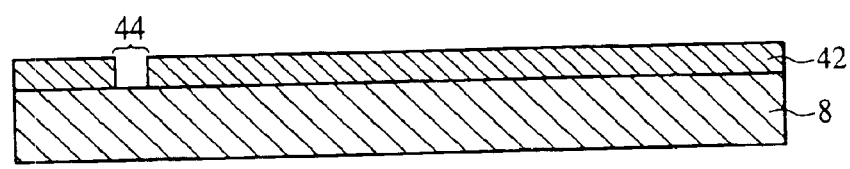
FIGS. 19A to 19C are sectional views of the micro machine according to the third embodiment of the present invention in the steps of the method for fabricating the micro machine, which show the method (Part 2).

Next, as shown in FIG. 19A, a silicon substrate 8 is prepared.

Then, in the same way as in the micro machine fabricating method described above with reference to FIG. 4A, a photoresist film 42 is formed. Then, an opening 44 is formed in the photoresist film 42 down to the silicon substrate 8 (see FIG. 19A).

Figure 19B:
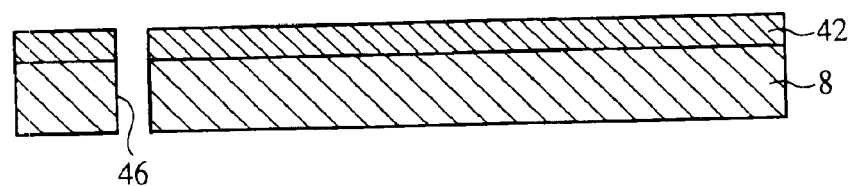
Figure 19C:
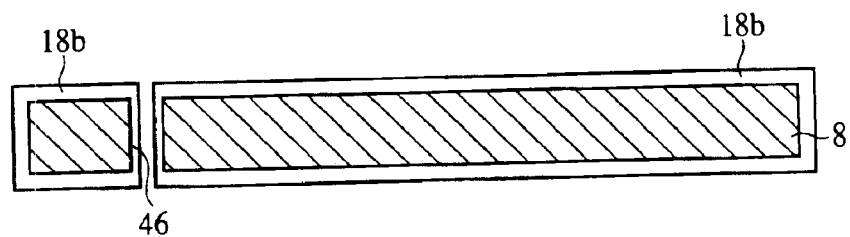

Next, in the same way as in the micro machine fabricating method described above with reference to FIG. 4B, a through-hole 46 is formed in the silicon substrate 8 (see FIG. 19B).

Then, in the same way as in the micro machine fabricating method described above with reference to FIG. 4E, a silicon oxide film 18b is formed on the surface of the silicon substrate 8 and the inside wall of the through-hole 46.

Next, the silicon substrate 8 is laid on the side of the silicon substrate 6 where the silicon oxide film 38 is buried. When the silicon substrate 6 and the silicon substrate 8 are laid on each other, the through-holes 30, 46 are used, as in the micro machine fabricating method described above with reference to FIG. 5A.

Then, thermal processing is performed in a oxidizing atmosphere. Thermal processing conditions are the same as in the micro machine fabricating method described above with reference to FIG. 5A.

Figure 20A:
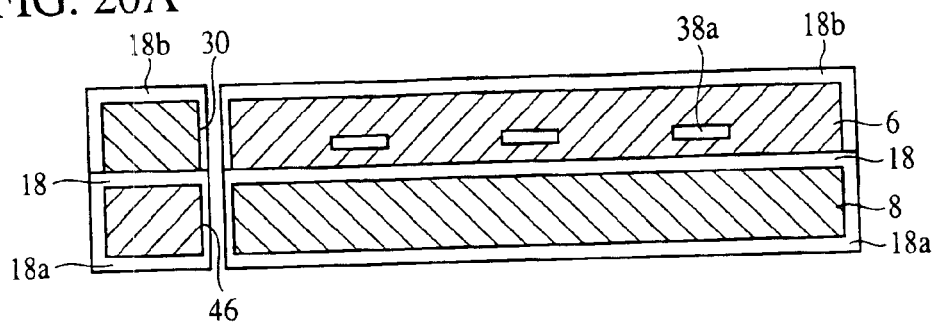
FIGS. 20A to 20D is sectional views of the micro machine according to the third embodiment of the present invention in the steps of the method for fabricating the micro machine, which show the method (Part 3).
Figure 20B:
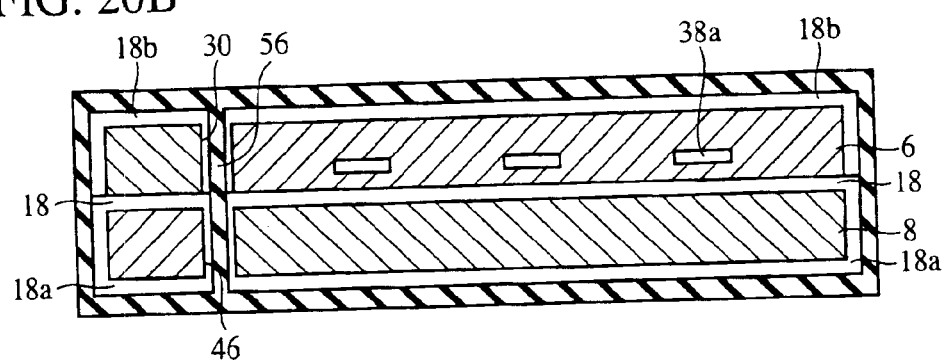

Next, as shown in FIG. 20B, a buried layer 56 of, e.g., polysilicon is buried in the through-holes 30, 40 by, e.g., CVD.

The material of the buried layer 56 is not limited to polysilicon, as described above.

Figure 20C:
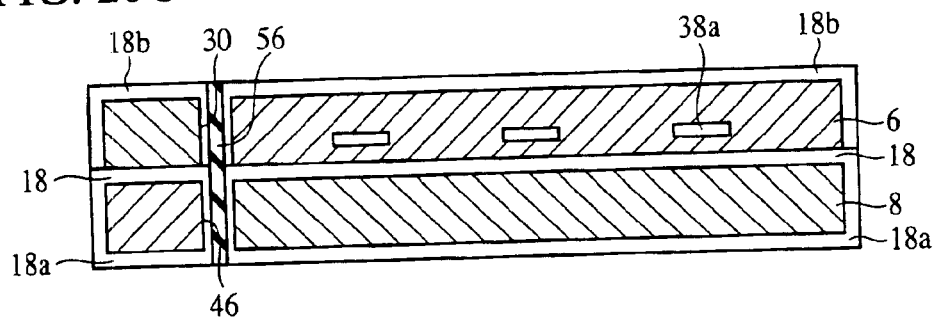

Then, as shown in FIG. 20C, the buried layer 56 formed on the upper side of the silicon substrate 6 and on the under side of the silicon substrate 8 is removed. Thus, the buried layer 56 is buried in the through-holes 30, 46.

Figure 20D:
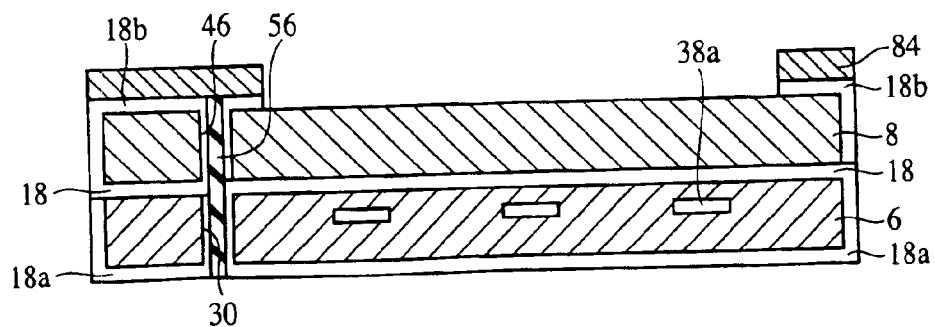

Then, as shown in FIG. 20D, the silicon substrates 6, 8 are turned over.

Next, a photoresist film 84 is formed on the entire surface of the silicon substrate 8 by, e.g., spin coating.

Then, the photoresist film 84 is patterned by photolithography.

Then, with the photoresist film 84 as a mask, the silicon oxide film 18b is etched. The silicon oxide film 18b functions as a hard mask in etching the silicon substrate 8.

Figure 21A:
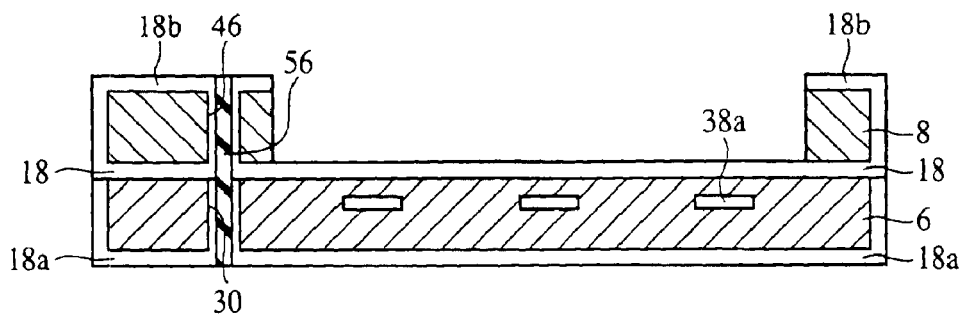
FIGS. 21A to 21D is sectional views of the micro machine according to the third embodiment of the present invention in the steps of the method for fabricating the micro machine, which show the method (Part 4).

Next, as shown in FIG. 21A, with the silicon oxide film 18b as a mask and the silicon oxide film 18 as an etching stopper, the silicon substrate 8 is etched.

Figure 21B:
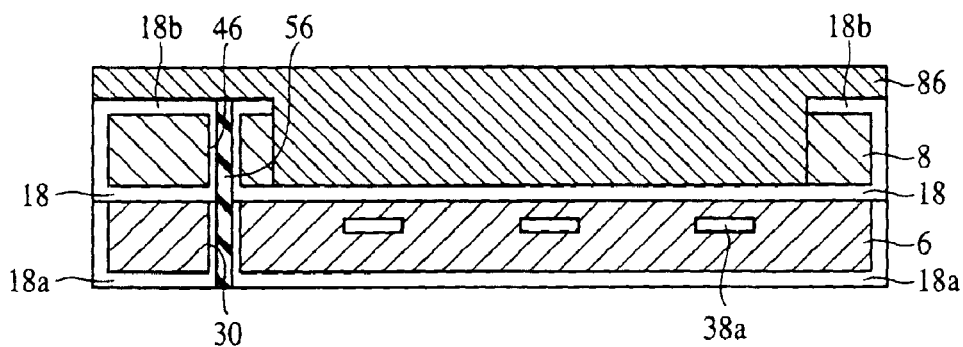

Then, as shown in FIG. 21B, a protection film 86 of polyimide or resist is formed on the entire surface by, e.g., spin coating.

Figure 21C:
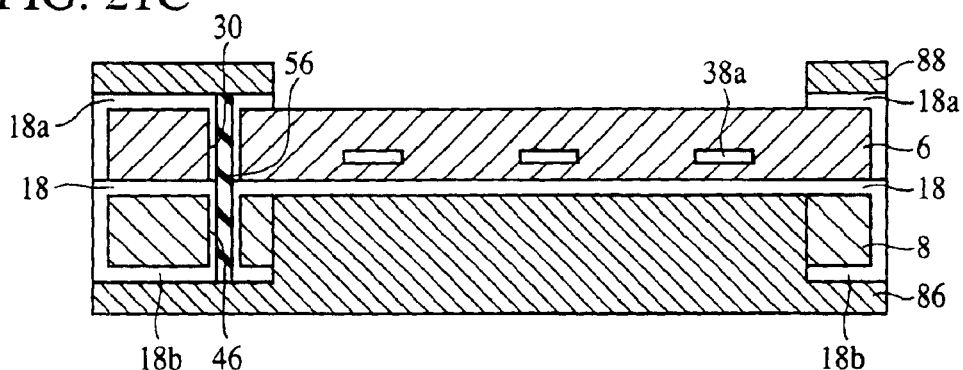

Next, as shown in FIG. 21C, the silicon substrates 6, 8 are turned over.

Then, a photoresist film 88 is formed on the entire surface by, e.g., spin coating.

Then, the photoresist film 88 is patterned by photolithography.

Figure 21D:
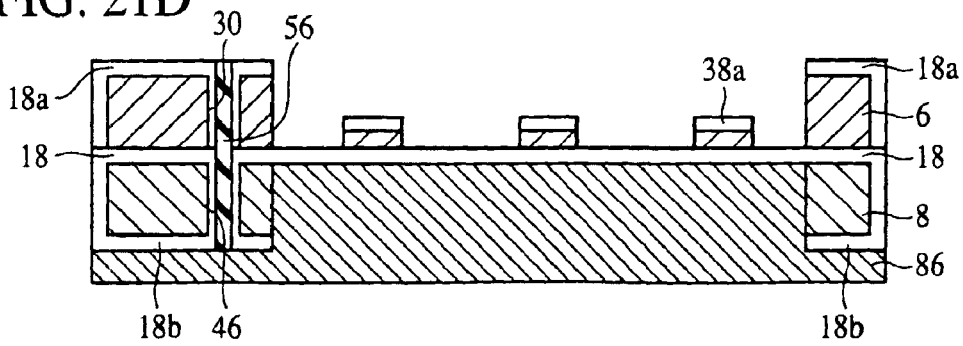

Next, as shown in FIG. 21D, with the photoresist film 88 as a mask the silicon oxide film 18a is etched. The silicon oxide film 18a acts as a hard mask in etching the silicon substrate 6.

Then, with the silicon oxide film 18a and the silicon oxide film 38a as a mask and the silicon oxide film 18 as an etching stopper, the silicon substrate 6 is etched.

Figure 22:
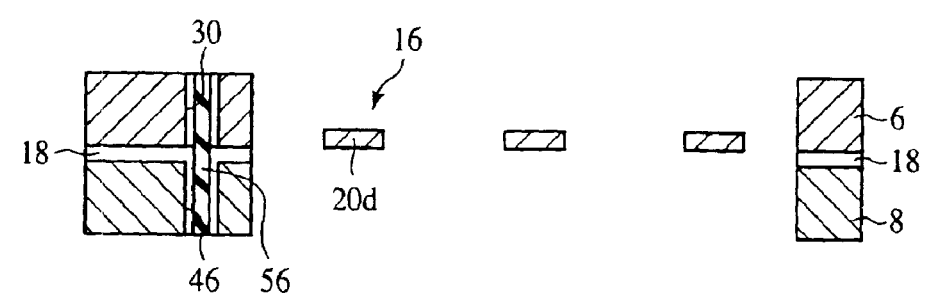
FIG. 22 is sectional view of the micro machine according to the third embodiment of the present invention in the steps of the method for fabricating the micro machine, which show the method (Part 5).

Next, as shown in FIG. 22, the protection film 86 is removed.

Next, the silicon oxide film etched off.

Thus, the micro machine according to the present embodiment is fabricated.

[A Fourth Embodiment]

The micro machine according to a fourth embodiment of the present invention and the method for fabricating the micro machine will be explained with reference to FIGS. 23A to 24D. FIGS. 23A to 24D are sectional views of the micro machine according to the present embodiment in the steps of the method for fabricating the micro machine, which show the method. The same members of the present embodiment as those of the micro machine and the method for fabricating the same according to the first to the third embodiments shown in FIGS. 1 to 22 are represented by the same reference numbers not to repeat or to simplify their explanation.

The structure of the micro machine according to the present embodiment is substantially the same as that of the micro machine according to the third embodiment shown in FIGS. 17A and 17B, and its explanation is not repeated.

Next, the method for fabricating the micro machine according to the present embodiment will be explained with reference to FIGS. 23A to 24D.

The method for fabricating the micro machine according to the present embodiment is characterized mainly in that oxygen ions are implanted in a silicon substrate 6, and then a silicon layer 6d is formed further on a silicon substrate 6.

Figure 23A:
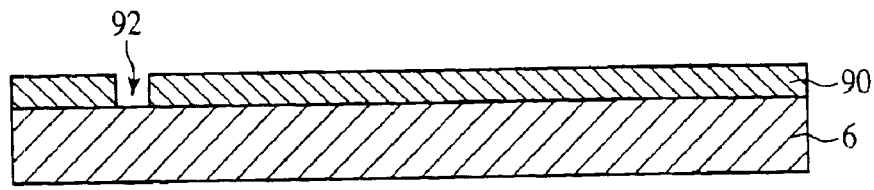
FIGS. 23A to 23E are sectional views of the micro machine according to a fourth embodiment of the present invention in the steps of the method for fabricating the micro machine, which show the method (Part 1).

First, as shown in FIG. 23A, a silicon substrate 6 is prepared.

Then, a photoresist film 90 is formed on the entire surface by, e.g., spin coating.

Next, the photoresist film 90 is patterned by photolithography.

Then, with the photoresist film 90 as a mask, the silicon substrate 6 is etched down to, e.g., 5 μm-depth. Thus, a cavity 92 is formed in the silicon substrate 6. The cavity 92 acts as an alignment mark.

Figure 23B:
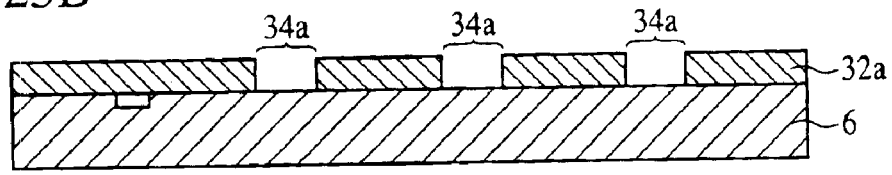

Then, in the same way as in the micro machine fabricating method described above with reference to FIG. 18C, a photoresist film 32a is formed, and openings 34a are formed in the photoresist film 32a down to the silicon substrate 6 (see FIG. 23B).

Figure 23C:
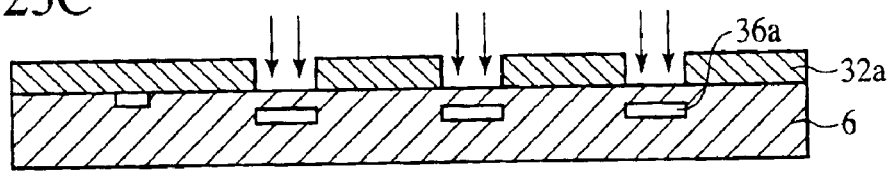

Next, in the same way as in the micro machine fabricating method described above with reference to FIG. 18D, oxygen ions are implanted in the silicon substrate 6 (see FIG. 23C).

Figure 23D:
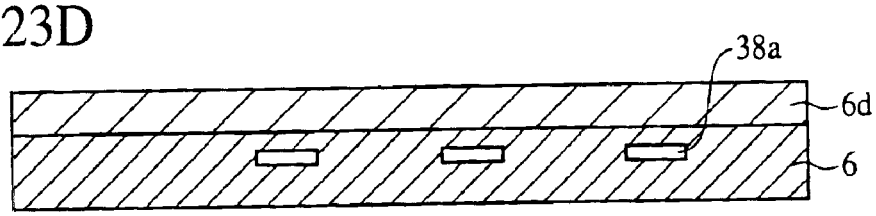

Then, as shown in FIG. 23D, a silicon layer 6d of, e.g., a 100 μm-thickness is formed on the entire surface. As the silicon layer 6d, a polysilicon layer may be deposited, or a silicon layer 6 is epitaxially grown on the silicon substrate 6.

Figure 23E:
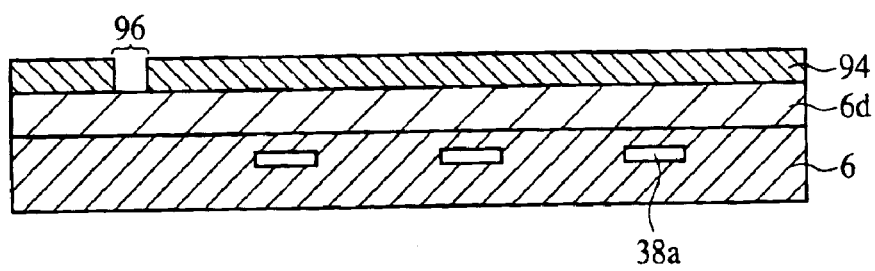

Next, as shown in FIG. 23E, a photoresist film 94 is formed on the entire surface by, e.g., spin coating.

Then, the photoresist film 94 is patterned by photolithography. Thus, an opening 96 for forming a through-hole 30a is formed in the photoresist film 94.

Next, with the photoresist film 94 as a mask, the silicon layer 6d and the silicon substrate 6 are etched. Thus, the through-hole 30a is formed in the silicon layer 6d and the silicon substrate 6 (see FIG. 24A).

Figure 24A:
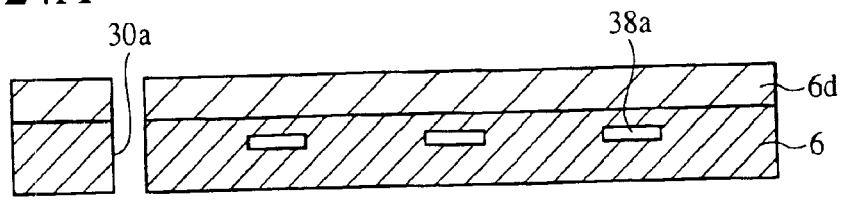
FIGS. 24A to 24D are sectional views of the micro machine according to the fourth embodiment of the present invention in the steps of the method for fabricating the micro machine, which show the method (Part 2).
Figure 24B:
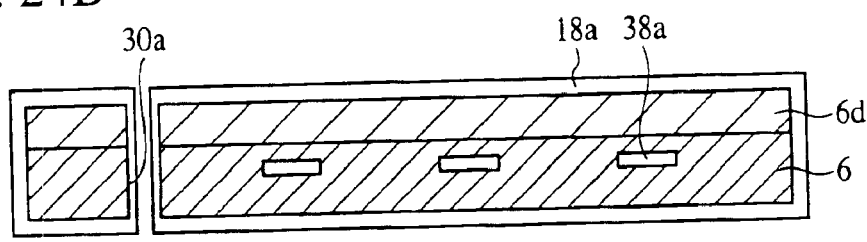
Figure 24C:
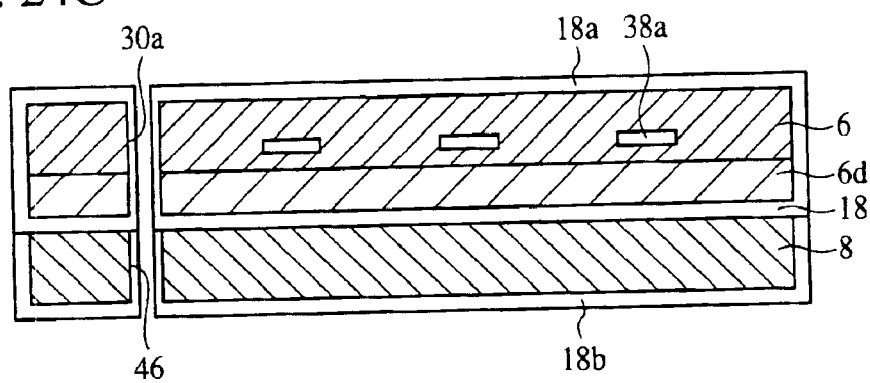
Figure 24D:
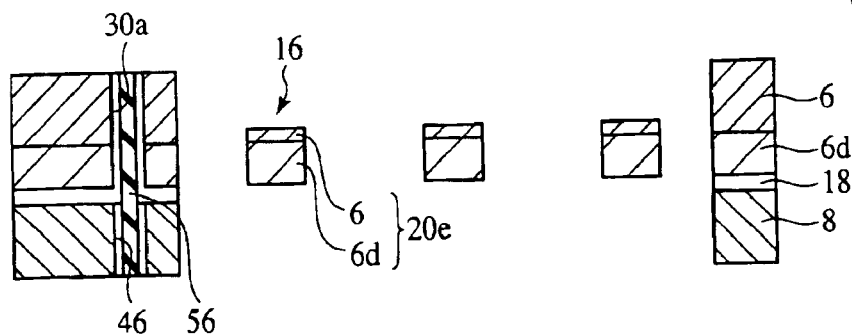
Figure 25A:
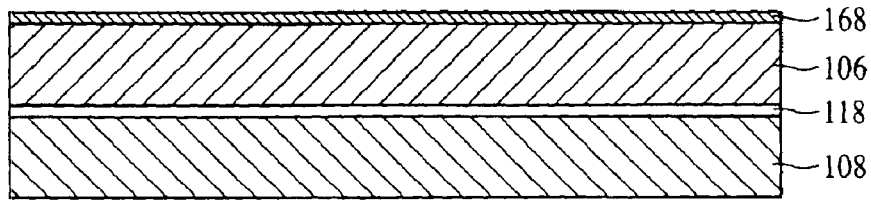
FIGS. 25A to 25D are sectional views of the proposed method for fabricating an optical switch having a torsion bar (Part 1).
Figure 25B:
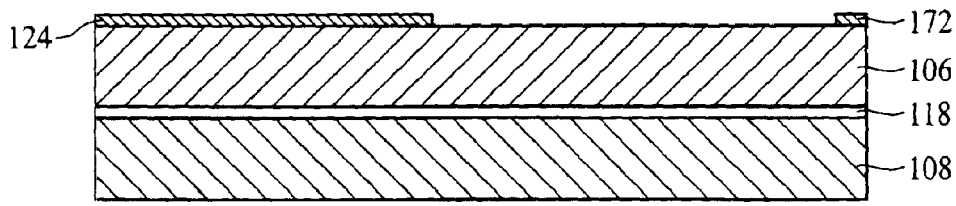
Figure 25C:
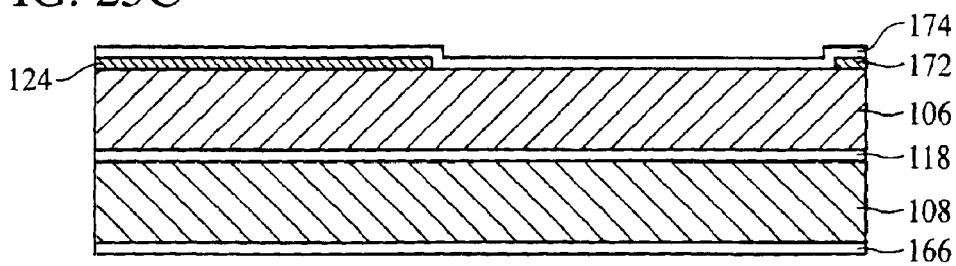
Figure 25D:
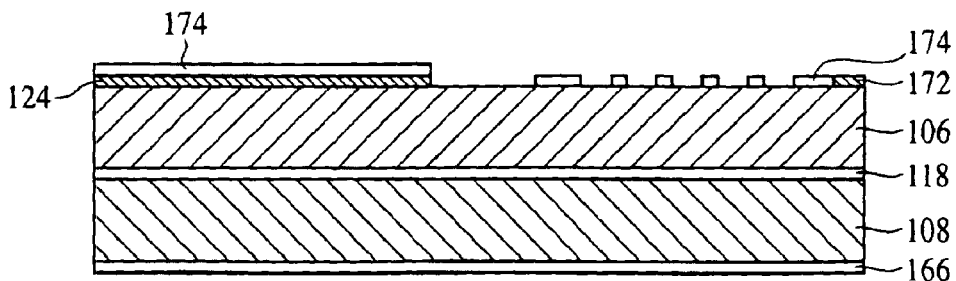
Figure 26A:
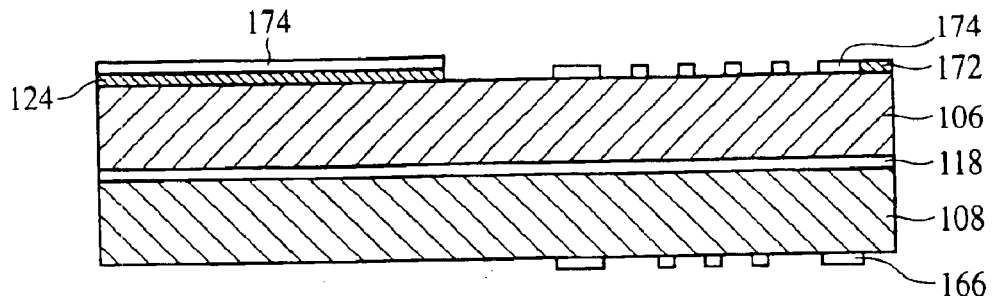
FIGS. 26A to 26D are sectional views of the proposed method for fabricating an optical switch having a torsion bar (Part 2).
Figure 26B:
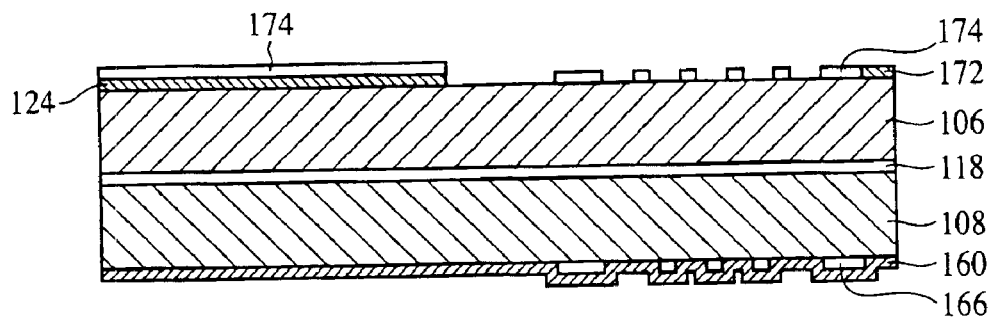
Figure 26C:
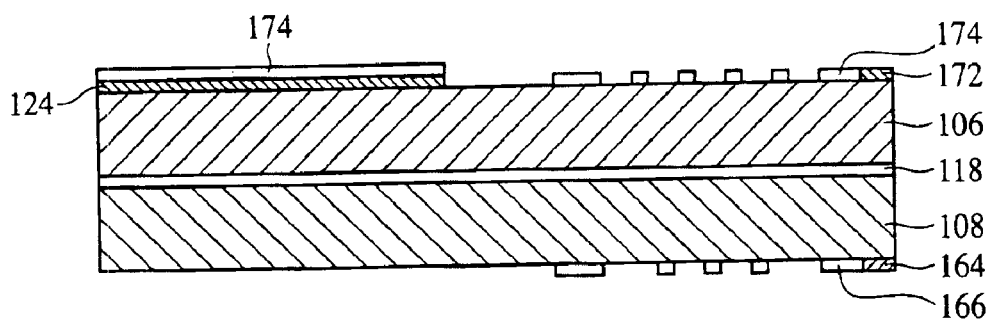
Figure 26D:
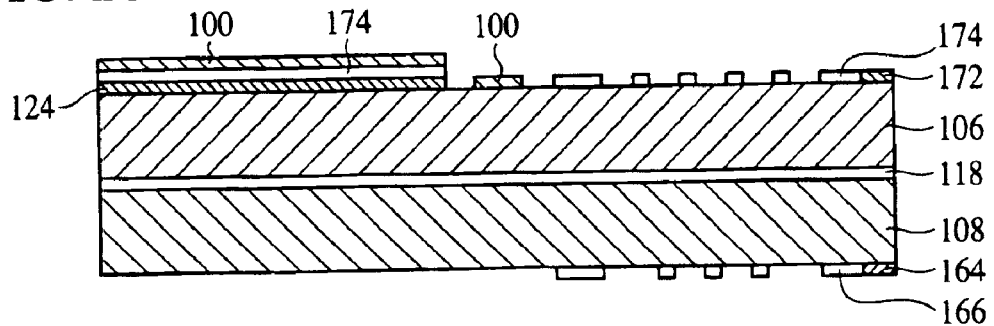
Figure 27A:
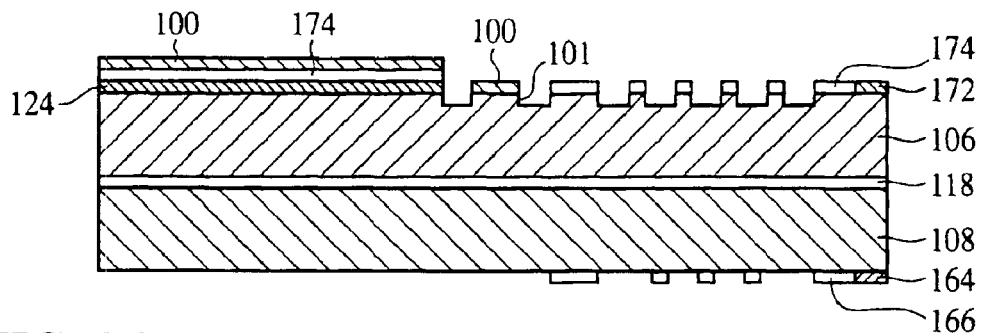
FIGS. 27A to 27D are sectional views of the proposed method for fabricating an optical switch having a torsion bar (Part 3).
Figure 27B:
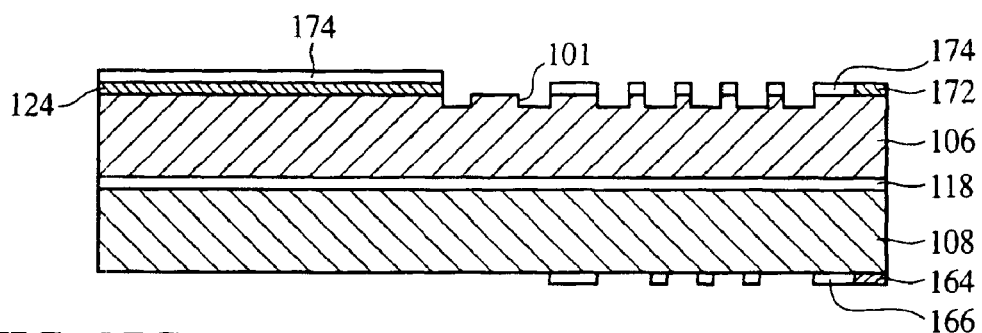
Figure 27C:
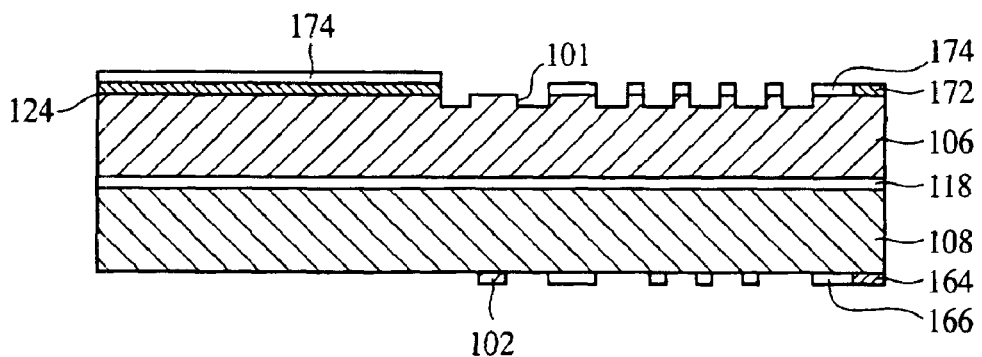
Figure 27D:
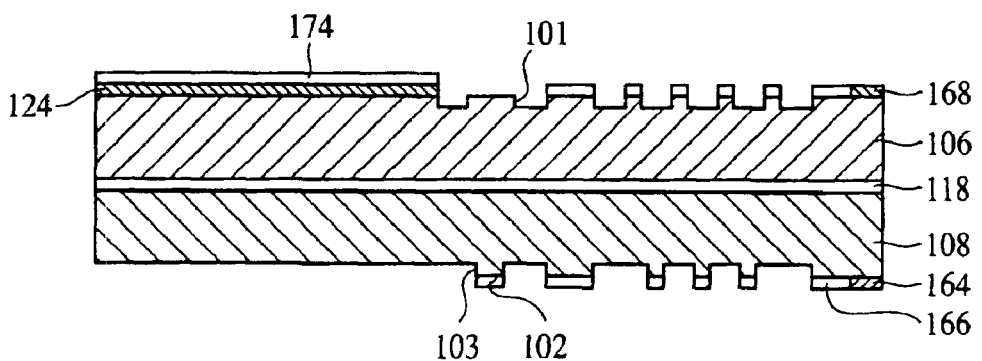
Figure 28A:
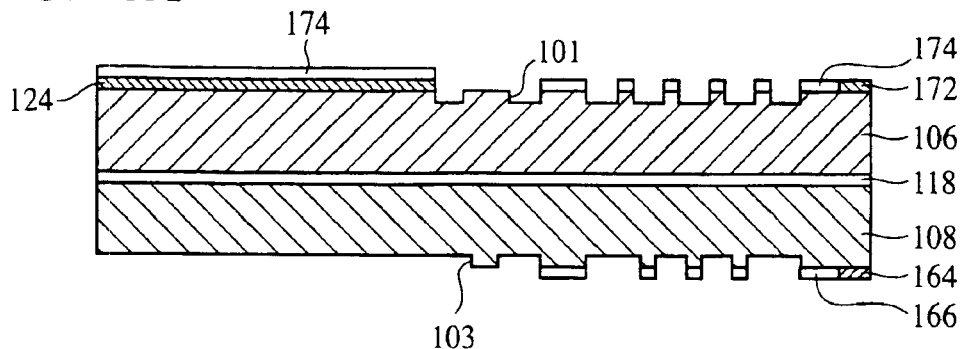
FIGS. 28A to 28D are sectional views of the proposed method for fabricating an optical switch having a torsion bar (Part 4).
Figure 28B:
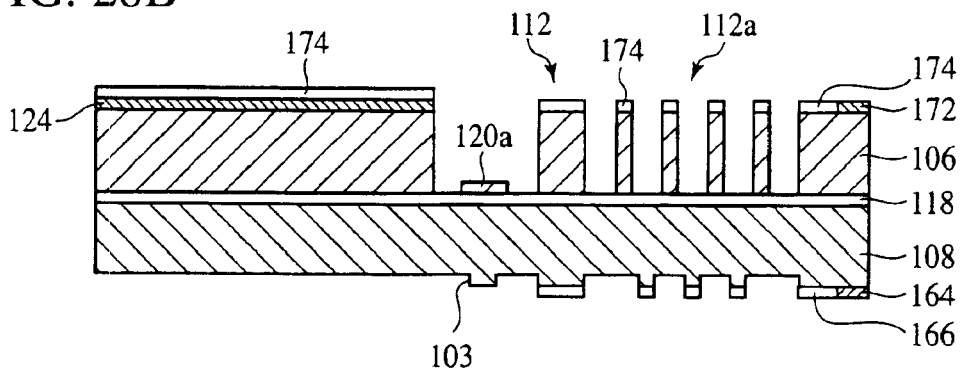
Figure 28C:
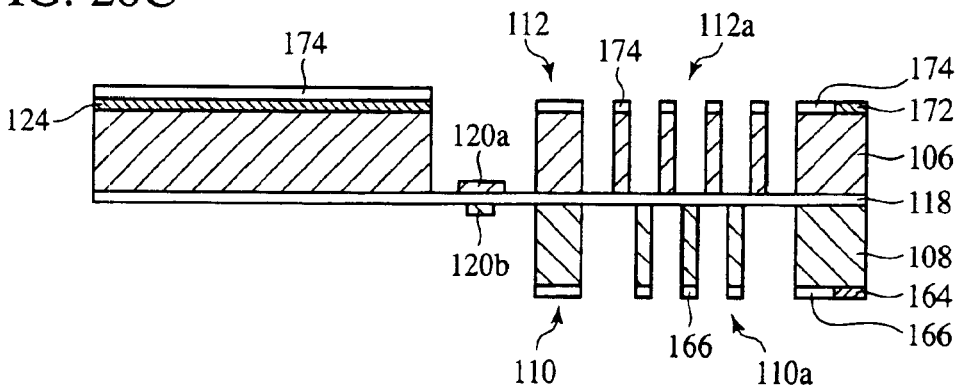
Figure 28D:
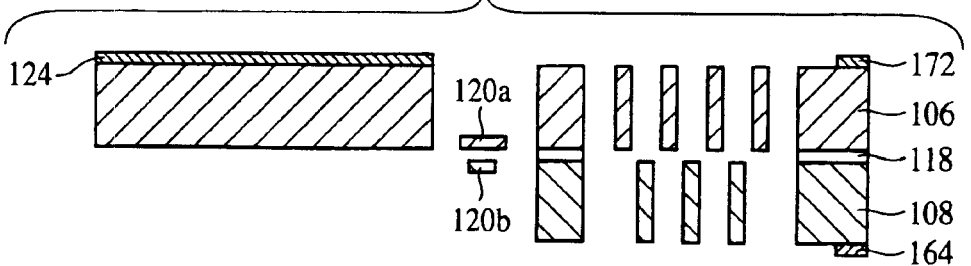

Then, in the same way as in the micro machine fabricating method described above with reference to FIG. 18E, a silicon oxide film 18a is formed (see FIG. 24B).

Next, a silicon substrate 8 is prepared.

Then, in the same way as in the micro machine fabricating method described above with reference to FIGS. 19A and 19B, a through-hole 46 is formed in the silicon substrate 8.

Next, in the same way as in the micro machine fabricating method described above with reference to FIG. 19C, a silicon oxide film 18b is formed on the surface of the silicon substrate 8 and the inside wall of the through-hole 46.

Then, the silicon substrate 8 is laid on the side of the silicon substrate 6 with the silicon oxide film 38a buried in. When the silicon substrate 6 and the silicon substrate 8 are laid on each other, the rough-holes 30a, 46 are used as in the micro machine fabricating method described above with reference to FIG. 20A.

Next, thermal processing is performed in an oxidizing atmosphere. Thermal processing conditions are the same as in the micro machine fabricating method described above with reference to FIG. 20A.

The following steps of the micro machine fabricating method are the same as those of the micro machine fabricating method according to the third embodiment shown in FIGS. 20B to 22, and their explanation is not repeated.

With the silicon oxide film 38a as a mask and the silicon oxide film 18 as an etching stopper, the silicon substrate 6 and the silicon layer 6d are etched to form a spring portion 20e. Accordingly, the spring portion 20e constituting a torsion bar 16 is formed of the silicon substrate 6 and the silicon layer 6d (see FIG. 24D).

Thus, the micro machine according to the present embodiment is fabricated.

In the present embodiment, the silicon layer 6d is formed on the silicon substrate 6 after oxygen ions have been implanted in the silicon substrate 6, which permits the silicon oxide film 38a to be buried in the silicon layer 6d at a required depth from the surface thereof. Thus, according to the present embodiment, the thickness of the spring portion 20e constituting the torsion bar 16 can be set more easily at a required thickness.

[Modifications]

The present invention is not limited to the above-described embodiments and can cover other various modifications.

The above-described embodiments have been explained by means of, e.g., the method for fabricating an optical switch and the method for fabricating resonator. However, the present invention is not limited to the optical switch fabricating method and the resonator fabricating method but is applicable to methods for fabricating all micro machines having torsion bars.

What is claimed is:

1. A method for fabricating a micro machine comprising the steps of:

implanting oxygen ions into a first region of a first semiconductor substrate, and performing thermal processing to form an oxide film buried in the first semiconductor substrate, spaced from the surface of the first semiconductor substrate;

bonding the surface of the first semiconductor substrate with the oxide film buried in to a second semiconductor substrate with an insulation film therebetween;

forming a first mask with an opening in the first region and a second region on both sides of the first region on the surface of the first semiconductor substrate, which is opposite to the surface with the oxide film buried in;

etching the first semiconductor substrate with the first mask and the oxide film as a mask to form a spring portion integral with the first semiconductor substrate between the oxide film and the insulation film to thereby form a torsion bar including the spring portion;

forming a second mask with an opening in the first region and the second region on the surface of the second semiconductor substrate, which is opposite to the surface bonded to the first semiconductor substrate;

etching the second semiconductor substrate with the second mask as a mask; and etching the insulation film in the first region and the second region.

2. A method for fabricating a micro machine according to claim 1, wherein in the step of bonding the first semiconductor substrate to the second semiconductor substrate, the first semiconductor substrate and the second semiconductor substrate are bonded to each other by the thermal processing.

3. A method for fabricating a micro machine according to claim 1, wherein in the oxide film burying step, after oxygen ions have been implanted in the first semiconductor substrate, a semiconductor layer is further formed on the surface of the first semiconductor substrate with the oxygen ions implanted in.

4. A method for fabricating a micro machine according to claim 3, which further comprises, prior to the step of bonding the first semiconductor substrate to the second semiconductor substrate, the step of:

implanting oxygen ions in the first region on the side of the surface of the second semiconductor substrate, which is to be bonded to the first semiconductor substrate, and performing thermal processing to thereby form another oxide film buried in the second semiconductor substrate, spaced from the surface of the second semiconductor substrate, and in which in the step of bonding the first semiconductor substrate to the second semiconductor substrate, the surface of the first semiconductor substrate with the oxide film buried in is bonded to the surface of the second semiconductor substrate with said another oxide film buried in with the insulation film therebetween, and in the torsion bar forming step, with the second mask and said another oxide film as a mask, the second semiconductor substrate is etched to form another spring portion integral with the second semiconductor substrate between said another oxide film and the insulation film to thereby form the torsion bar further including said another spring portion.

5. A method for fabricating a micro machine according to claim 4, wherein in the step of burying said another oxide film, after oxygen ions have been implanted in the second semiconductor substrate, another semiconductor layer is further formed on the surface of the second semiconductor substrate with the oxygen ions implanted in.

6. A method for fabricating a micro machine according to claim 1, which further comprises, prior to the step of bonding the first semiconductor substrate to the second semiconductor substrate, the step of:

forming a first through-hole in the first semiconductor substrate and forming a second through-hole in the second semiconductor substrate; and in which in the step of bonding the first semiconductor substrate to the second semiconductor substrate, the first semiconductor substrate and the second semiconductor substrate are aligned by using the first through-hole and the second through-hole.

7. A method for fabricating a micro machine according to claim 6, further comprising the step of:

burying a buried layer in the first through-hole and the second through-hole.

8. A method for fabricating a micro machine according to claim 7, wherein a part of the buried layer buried in the first through-hole and the second through-hole is removed to thereby form a cavity, and the cavity is used in the alignment.

9. A method for fabricating a micro machine according to claim 1, which further comprises, prior to the step of bonding the first semiconductor substrate to the second semiconductor substrate, the step of:

implanting oxygen ions in the first region on the side of the surface of the second semiconductor substrate, which is to be bonded to the first semiconductor substrate, and performing thermal processing to thereby form another oxide film buried in the second semiconductor substrate, spaced from the surface of the second semiconductor substrate, and in which in the step of bonding the first semiconductor substrate to the second semiconductor substrate, the surface of the first semiconductor substrate with the oxide film buried in is bonded to the surface of the second semiconductor substrate with said another oxide film buried in with the insulation film therebetween, and in the torsion bar forming step, with the second mask and said another oxide film as a mask, the second semiconductor substrate is etched to form another spring portion integral with the second semiconductor substrate between said another oxide film and the insulation film to thereby form the torsion bar further including said another spring portion.

10. A method for fabricating a micro machine according to claim 9, wherein in the step of burying said another oxide film, after oxygen ions have been implanted in the second semiconductor substrate, another semiconductor layer is further formed on the surface of the second semiconductor substrate with the oxygen ions implanted in.

11. A method for fabricating a micro machine according to claim 9, wherein in the step of bonding the first semiconductor substrate to the second semiconductor substrate, the first semiconductor substrate and the second semiconductor substrate are bonded to each other by the thermal processing.

12. A method for fabricating a micro machine according to claim 9, which further comprises, prior to the step of bonding the first semiconductor substrate to the second semiconductor substrate, the step of:

forming a first through-hole in the first semiconductor substrate and forming a second through-hole in the second semiconductor substrate; and in which in the step of bonding the first semiconductor substrate to the second semiconductor substrate, the first semiconductor substrate and the second semiconductor substrate are aligned by using the first through-hole and the second through-hole.

13. A method for fabricating a micro machine according to claim 12, further comprising the step of:

burying a buried layer in the first through-hole and the second through-hole.

14. A method for fabricating a micro machine according to claim 13, wherein a part of the buried layer buried in the first through-hole and the second through-hole is removed to thereby form a cavity, and the cavity is used in the alignment.

15. A method for fabricating a micro machine comprising the steps of:

forming an insulation film on a semiconductor substrate;

forming a first semiconductor layer on the insulation film;

forming a first mask in a first region on the first semiconductor layer;

growing a second semiconductor layer on the first semiconductor layer and the first mask;

forming on the second semiconductor layer a second mask with an opening in the first region and a second region on both sides of the first region;

etching the first semiconductor layer and the second semiconductor layer with the first mask and the second mask as a mask to thereby form a torsion bar integral with the first semiconductor layer between the first mask and the insulation film;

forming a third mask with an opening in the first region and the second region on the surface of the semiconductor substrate, which is opposite to the surface with the first semiconductor layer formed on; and etching the semiconductor substrate with the third mask as a mask.

* * * * *